US010797066B2

(12) United States Patent
Lee et al.

(10) Patent No.: US 10,797,066 B2
(45) Date of Patent: Oct. 6, 2020

(54) MEMORY DEVICES WITH THREE-DIMENSIONAL STRUCTURE

(71) Applicant: Samsung Electronics Co., Ltd., Suwon-si, Gyeonggi-do (KR)

(72) Inventors: Youn-Yeol Lee, Seoul (KR); Chanho Kim, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 10 days.

(21) Appl. No.: 16/030,170

(22) Filed: Jul. 9, 2018

(65) Prior Publication Data
US 2019/0189632 A1 Jun. 20, 2019

(30) Foreign Application Priority Data
Dec. 20, 2017 (KR) ........................ 10-2017-0175808

(51) Int. Cl.
*H01L 27/11575* (2017.01)
*H01L 27/11573* (2017.01)
*H01L 27/11582* (2017.01)
*H01L 27/1157* (2017.01)
*G11C 16/04* (2006.01)

(52) U.S. Cl.
CPC .... *H01L 27/11575* (2013.01); *H01L 27/1157* (2013.01); *H01L 27/11573* (2013.01); *H01L 27/11582* (2013.01); *G11C 16/0483* (2013.01)

(58) Field of Classification Search
CPC .......... H01L 27/11575; H01L 27/1157; H01L 27/11573; H01L 27/11582; G11C 16/0483
See application file for complete search history.

(56) References Cited

U.S. PATENT DOCUMENTS

| 7,679,133 | B2 | 3/2010 | Son et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 9,230,987 | B2 | 1/2016 | Pachamuthu et al. |
| 9,502,471 | B1* | 11/2016 | Lu ........................ H01L 27/2481 |
| 9,627,403 | B2 | 4/2017 | Liu et al. |
| 9,691,781 | B1 | 6/2017 | Nishikawa et al. |
| 9,881,929 | B1* | 1/2018 | Ravikirthi ......... H01L 27/11519 |
| 9,960,181 | B1* | 5/2018 | Cui .................... H01L 27/11556 |

(Continued)

FOREIGN PATENT DOCUMENTS

KR 10-1487746 B1 2/2015

*Primary Examiner* — Peter Bradford
(74) *Attorney, Agent, or Firm* — Harness, Dickey & Pierce, P.L.C.

(57) ABSTRACT

A memory device includes a substrate, a first memory structure including a plurality of first word lines stacked on the substrate in a direction perpendicular to a top surface of the substrate, an inter-metal layer on the first memory structure and including a plurality of intermediate pads connected with separate, respective first word lines of the plurality of first word lines, a second memory structure including a plurality of second word lines stacked on the inter-metal layer in the direction perpendicular to the top surface of the substrate, and an upper metal layer on the second memory structure and including a plurality of upper pads connected with separate, respective second word lines of the plurality of second word lines.

10 Claims, 20 Drawing Sheets

(56) References Cited

U.S. PATENT DOCUMENTS

| | | | |
|---|---|---|---|
| 2011/0151667 A1* | 6/2011 | Hwang | H01L 23/5226 |
| | | | 438/667 |
| 2011/0233648 A1 | 9/2011 | Seol et al. | |
| 2013/0279262 A1* | 10/2013 | Yoon | G11C 16/0483 |
| | | | 365/185.18 |
| 2015/0162341 A1 | 6/2015 | Aritome | |
| 2016/0133644 A1 | 5/2016 | Lee | |
| 2017/0062454 A1 | 3/2017 | Lu et al. | |
| 2017/0179151 A1 | 6/2017 | Kai et al. | |
| 2017/0236746 A1 | 8/2017 | Yu et al. | |
| 2017/0236835 A1 | 8/2017 | Nakamura et al. | |

* cited by examiner

MEMORY DEVICES WITH THREE-DIMENSIONAL STRUCTURE

CROSS-REFERENCE TO RELATED APPLICATIONS

This application claims priority under 35 U.S.C. § 119 to Korean Patent Application No. 10-2017-0175808 filed on Dec. 20, 2017, in the Korean Intellectual Property Office, the disclosures of which are incorporated by reference herein in their entireties.

BACKGROUND

Example embodiments of the inventive concepts disclosed herein relate to semiconductor memories, and more particularly, relate to memory devices with three-dimensional structures.

Semiconductor memories are classified into volatile memory devices, in which stored data disappear when power is interrupted, and nonvolatile memory devices, in which stored data are retained even when power is interrupted.

Flash memories, being a type of nonvolatile memory devices, are widely used as mass storage media. As the degree of integration of flash memories is improved, a three-dimensional structure of flash memories is being developed. The three-dimensional structure of a memory device may result in a manufacturing process to manufacture the memory device and/or internal lines (or interconnections) of the memory device being relatively complicated.

SUMMARY

Example embodiments of the inventive concepts provide memory devices with reduced size based on connecting lines of multi-stack memory structures of a nonvolatile memory device with a peripheral circuit through different layers.

According to some example embodiments, a memory device may include a substrate, a first memory structure, an inter-metal layer, a second memory structure, and an upper metal layer. The first memory structure may include a plurality of first word lines stacked on the substrate in a direction perpendicular to a top surface of the substrate. The inter-metal layer may be on the first memory structure and may include a plurality of intermediate pads, the plurality of intermediate pads connected with separate, respective first word lines of the plurality of first word lines. The second memory structure may include a plurality of second word lines stacked on the inter-metal layer in the direction perpendicular to the top surface of the substrate. The upper metal layer may be on the second memory structure and may include a plurality of upper pads, the plurality of upper pads connected with separate, respective second word lines of the plurality of second word lines.

According to some example embodiments, a memory device may include a substrate, a peripheral circuit on the substrate, a first memory structure, an inter-metal layer on the first memory structure, a second memory structure, and an upper metal layer on the second memory structure. The first memory structure may include a plurality of first word lines stacked on the substrate in a direction perpendicular to a top surface of the substrate. The inter-metal layer may include a plurality of intermediate conductive lines electrically coupling the plurality of first word lines to the peripheral circuit. The second memory structure may include a plurality of second word lines stacked on the inter-metal layer in the direction perpendicular to the top surface of the substrate. The upper metal layer may include a plurality of upper conductive lines electrically coupling the plurality of second word lines to the peripheral circuit.

According to some example embodiments, a memory device may include a substrate, a first memory structure, an inter-metal layer on the first memory structure, a second memory structure, and an upper metal layer on the second memory structure. The first memory structure may include a plurality of first word lines stacked on the substrate in a direction perpendicular to a top surface of the substrate and a plurality of first pillars extending through the plurality of first word lines on the substrate. The inter-metal layer may include a plurality of intermediate pads, the plurality of intermediate pads connected with separate, respective first word lines of the plurality of first word lines, and a plurality of intermediate connection pads, the plurality of intermediate connection pads connected with separate, respective first pillars of the plurality of first pillars. The second memory structure may include a plurality of second word lines stacked on the inter-metal layer in the direction perpendicular to the top surface of the substrate and a plurality of second pillars extending through the plurality of second word lines on the inter-metal layer, the plurality of second pillars connected with separate, respective intermediate connection pads of the plurality of intermediate connection pads. The upper metal layer may include a plurality of upper pads, the plurality of upper pads connected with separate, respective second word lines of the plurality of second word lines.

According to some example embodiments, a memory device may include a substrate, a first memory structure, an inter-metal layer on the first memory structure, a second memory structure, and an upper metal layer on the second memory structure. The first memory structure may include a plurality of first word lines stacked on the substrate in a direction perpendicular to a top surface of the substrate. The inter-metal layer may include a plurality of intermediate conductive lines, the plurality of intermediate conductive lines connected with separate, respective first word lines of the plurality of first word lines. The second memory structure may include a plurality of second word lines stacked on the inter-metal layer in the direction perpendicular to the substrate. The upper metal layer may include a plurality of upper conductive lines, the upper conductive lines connected with separate, respective second word lines of the plurality of second word lines.

According to some example embodiments, a memory device may include a substrate, a first memory structure on the substrate, an inter-metal layer on the first memory structure, a second memory structure on the inter-metal layer, an upper metal layer on the second memory structure, and a peripheral circuit electrically coupled with the first memory structure through the inter-metal layer. The first memory structure may have a first three-dimensional structure. The second memory structure may have a second three-dimensional structure, the second memory structure electrically coupled with the first memory structure through the inter-metal layer. The upper metal layer may include a plurality of bit lines electrically coupled with the first and second memory structures. The peripheral circuit may be electrically coupled with the second memory structure through the upper metal layer.

BRIEF DESCRIPTION OF THE FIGURES

The above and other objects and features of the inventive concepts will become apparent by describing in detail exemplary embodiments thereof with reference to the accompanying drawings.

DETAILED DESCRIPTION

Below, example embodiments of the inventive concepts may be described in detail and clearly to such an extent that an ordinary one in the art easily implements the inventive concepts.

Figure 1:
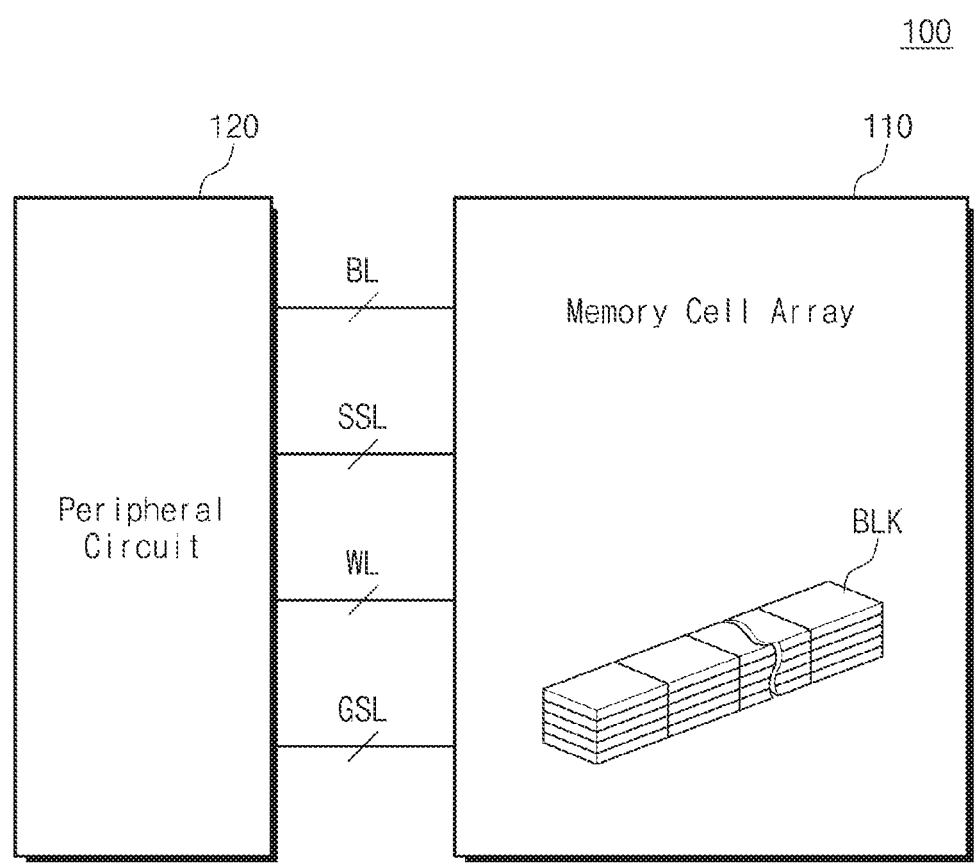
FIG. 1 is a block diagram illustrating a nonvolatile memory device according to some example embodiments of the inventive concepts.

FIG. 1 is a block diagram illustrating a nonvolatile memory device 100 according to some example embodiments of the inventive concepts. Referring to FIG. 1, the nonvolatile memory device 100 may include a memory cell array 110 and a peripheral circuit 120.

The memory cell array 110 may include a plurality of memory blocks BLK. Each of the memory blocks BLK may include a plurality of cell strings, which are connected with bit lines BL and each of which includes a plurality of cell transistors connected in series. The plurality of cell transistors may be connected with string selection lines SSL, the word lines WL, and ground selection lines GSL.

The peripheral circuit 120 may be connected with the memory cell array 110 through the bit lines BL, the string selection lines SSL, the word lines WL, and the ground selection lines GSL. The peripheral circuit 120 may be configured to control voltages of the bit lines BL, the string selection lines SSL, the word lines WL, and the ground selection lines GSL under control of an external device (e.g., a memory controller). In some example embodiments, the peripheral circuit 120 may include various components, which are used to control voltages of the bit lines BL, the string selection lines SSL, the word lines WL, and the ground selection lines GSL, such as an address decoder, a page buffer, a control logic circuit, a voltage generator, an input/output circuit, etc.

In some example embodiments, each of the plurality of memory blocks BLK may include a three-dimensional memory structure. The 3-dimensional memory structure may be monolithically formed in one or more physical level(s) of a memory cell array having an active area arranged on a circuit related on a silicon substrate and an operation of memory cells. The circuit (i.e., a peripheral circuit) related to an operation of memory cells may be located in a substrate or on a substrate. The term "monolithic" means that layers of each level of the three-dimensional array are directly deposited on the layers of each underlying level of the three-dimensional array.

As some example embodiments of the inventive concepts, the three-dimensional memory structure includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The three-dimensional memory structure is formed of a plurality of levels and has word lines or bit lines shared among levels. The following patent documents, which are hereby incorporated by reference, describe suitable configurations for the three-dimensional memory structure: U.S. Pat. Nos. 7,679,133; 8,553,466; 8,654,587; 8,559,235; and US Pat. Pub. No. 2011/0233648.

In some example embodiments, the three-dimensional memory structures included in the plurality of memory blocks BLK may be stacked in a direction perpendicular to a substrate. That is, each of the plurality of memory blocks BLK may include a multi-stacked memory structure. A structure of each of the plurality of memory blocks BLK will be more fully described with reference to accompanying drawings.

Figure 2:
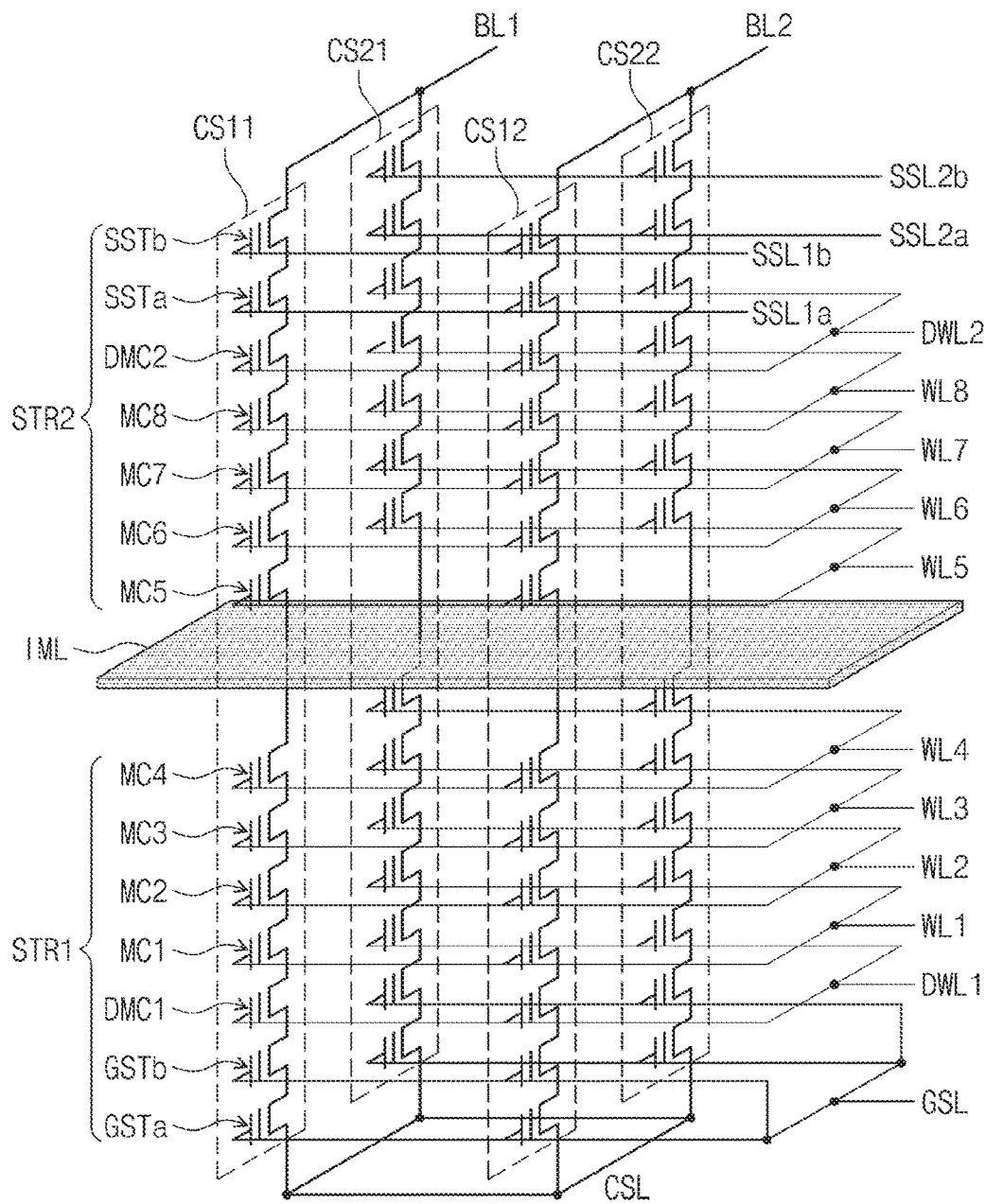
FIG. 2 is a circuit diagram illustrating a first memory block of a plurality of memory blocks of FIG. 1.

FIG. 2 is a circuit diagram illustrating a first memory block BLK1 of a plurality of memory blocks of FIG. 1. For brevity of illustration and convenience of description, embodiments according to the following drawings will be described with respect to the first memory block BLK1. However, the inventive concepts are not limited thereto.

Referring to FIG. 2, the first memory block BLK1 may include a plurality of cell strings CS11, CS12, CS21, and CS22. The plurality of cell strings CS11, CS12, CS21, and CS22 may be arranged along a row direction and a column direction to form rows and columns.

Each of the plurality of cell strings CS11, CS12, CS21, and CS22 may include a plurality of cell transistors. For example, each of the plurality of cell strings CS11, CS12, CS21, and CS22 may include string selection transistors SSTa and SSTb, a plurality of memory cells MC1 to MC8 (e.g., MC1, MC2, MC3, MC4, MC5, MC6, MC7, and MC8), ground selection transistors GSTa and GSTb, and dummy memory cells DMC1 and DMC2. In some example embodiments, each of the plurality of cell transistors included in the cell strings CS11, CS12, CS21, and CS22 may be a charge trap flash (CTF) memory cell.

In each cell string, the memory cells MC1 to MC8 may be serially connected and may be stacked in a height direction being a direction perpendicular to a plane (i.e., a substrate) defined by a row direction and a column direction. In each cell string, the string selection transistors SSTa and SSTb may be serially connected and may be arranged between the memory cells MC1 to MC8 and the corresponding one of bit lines BL1 and BL2. In each cell string, the ground selection transistors GSTa and GSTb may be serially connected and may be interposed between the memory cells MC1 to MC8 and a common source line CSL.

In some example embodiments, the first dummy memory cell DMC1 may be interposed between the memory cells MC1 to MC8 and the ground selection transistors GSTa and GSTb. In some example embodiments, the second dummy memory cell DMC2 may be interposed between the memory cells MC1 to MC8 and the string selection transistors SSTa and SSTb.

The ground selection transistors GSTa and GSTb of the cell strings CS11, CS12, CS21, and CS22 may be connected in common to a ground selection line GSL. In some example embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to a first ground selection line, and the first ground selection transistors GSTa of the cell strings CS21 and CS22 in the second row may be connected to a second ground selection line.

In some example embodiments, although not illustrated in FIG. 2, ground selection transistors provided at the same height from a substrate (not illustrated) may be connected to the same ground selection line, and ground selection transistors provided at different heights may be connected to different ground selection lines.

Memory cells of the same height from the substrate or the ground selection transistors GSTa and GSTb are connected in common to the same word line, and memory cells of different heights therefrom are connected to different word lines. For example, the memory cells MC1 to MC8 of the cell strings CS11, CS12, CS21, and CS22 are connected to a plurality of word lines WL1 to WL8 (WL1, WL2, WL3, WL4, WL5, WL6, WL7, and WL8).

First string selection transistors, which belong to the same row, from among the first string selection transistors SSTa at the same height are connected to the same string selection line, and first string selection transistors belonging to different rows are connected to different string selection lines. For example, the first string selection transistors SSTa of the cell strings CS11 and CS12 in the first row are connected in common to a string selection line SSL1a, and the first string selection transistors SSTa of the cell strings CS21 and CS22 in the second row are connected in common to a string selection line SSL2a.

Likewise, second string selection transistors, which belong to the same row, from among the second string selection transistors SSTb at the same height are connected to the same string selection line, and second string selection transistors in different rows are connected to different string selection lines. For example, the second string selection transistors SSTb of the cell strings CS11 and CS12 in the first row are connected in common to a string selection line SSL1b, and the second string selection transistors SSTb of the cell strings CS21 and CS22 in the second row are connected in common to a string selection line SSL2b.

In some example embodiments, dummy memory cells at the same height are connected with the same dummy word line, and dummy memory cells at different heights are connected with different dummy word lines. For example, the first dummy memory cells DMC1 are connected to a first dummy word line DWL1, and the second dummy memory cells DMC2 are connected to a second dummy word line DWL2.

In some example embodiments, the first memory block BLK1 illustrated in FIG. 2 is an example. For example, the number of cell strings may increase or decrease, and the number of rows of cell strings and the number of columns of cell strings may increase or decrease depending on the number of cell strings. Also, in the first memory block BLK1, the number of cell strings (GST, MC, DMC, SST, etc.) may increase or decrease, and a height of the first memory block BLK1 may increase or decrease depending on the number of cell transistors. Furthermore, the number of lines (GSL, WL, DWL, SSL, etc.) connected with cell transistors may increase or decrease depending on the number of cell transistors.

In some example embodiments, the first memory block BLK1 may include a first memory structure STR1 and a second memory structure STR2. The first memory structure STR1 may include cell transistors connected with the ground selection line GSL, the first dummy word line DWL1, and the first to fourth word lines WL1 to WL4. The second memory structure STR2 may include cell transistors connected with the fifth to eighth word lines WL5 to WL8, the second dummy word line DWL2, and the plurality of string selection lines SSL1a, SSL1b, SSL2a, and SSL2b.

The first memory structure STR1 may be provided over ("on") the substrate (not illustrated), and the second memory structure STR2 may be provided over the first memory structure STR1. In some example embodiments, the first and second memory structures STR1 and STR2 may be electrically connected to each other through an inter-metal layer IML. As described herein, an element that is "on" another element may be above the other element, below the other element, "directly on" (e.g., in contact with) the other element, "indirectly on" the other element, some combination thereof, or the like.

The inter-metal layer IML on the first memory structure STR1 may be a layer for providing intermediate connection pads configured to electrically connect ("electrically couple") the cell strings of the first memory structure STR1 and the cell strings of the second memory structure STR2. For example, the inter-metal layer IML may include a plurality of intermediate pads for connecting ("coupling") the cell strings CS11, CS12, CS21, and CS22 of the first memory structure STR1 and the second memory structure STR2. The cell strings of the first memory structure STR1 and the second memory structure STR2 may be connected to each other through an intermediate pad of the inter-metal layer IML.

That is, the first memory block BLK1 may have a multi-stacked structure. The multi-stacked structure may indicate a structure in which a plurality of memory structures are stacked in a direction perpendicular to the substrate and adjacent memory structures of the plurality of memory structures are connected through the inter-metal layer IML.

In some example embodiments, word lines (i.e., DWL1 and WL1 to WL4) or the ground selection line GSL connected with the first memory structure STR1 may be connected with the peripheral circuit 120 through the inter-metal layer IML. For example, the inter-metal layer IML may include a plurality of intermediate pads respectively corresponding to lines of the first memory structure STR1. Conductive lines for connecting the intermediate pads and the peripheral circuit 120 may be provided in the inter-metal layer IML. Restated, the plurality of intermediate pads (e.g., IPD1 as shown in at least FIG. 4) of the inter-metal layer IML may be connected with separate, respective first word lines of a plurality of first word lines (e.g., DWL1 and WL1 to WL4) in the first memory structure STR1.

Figure 4:
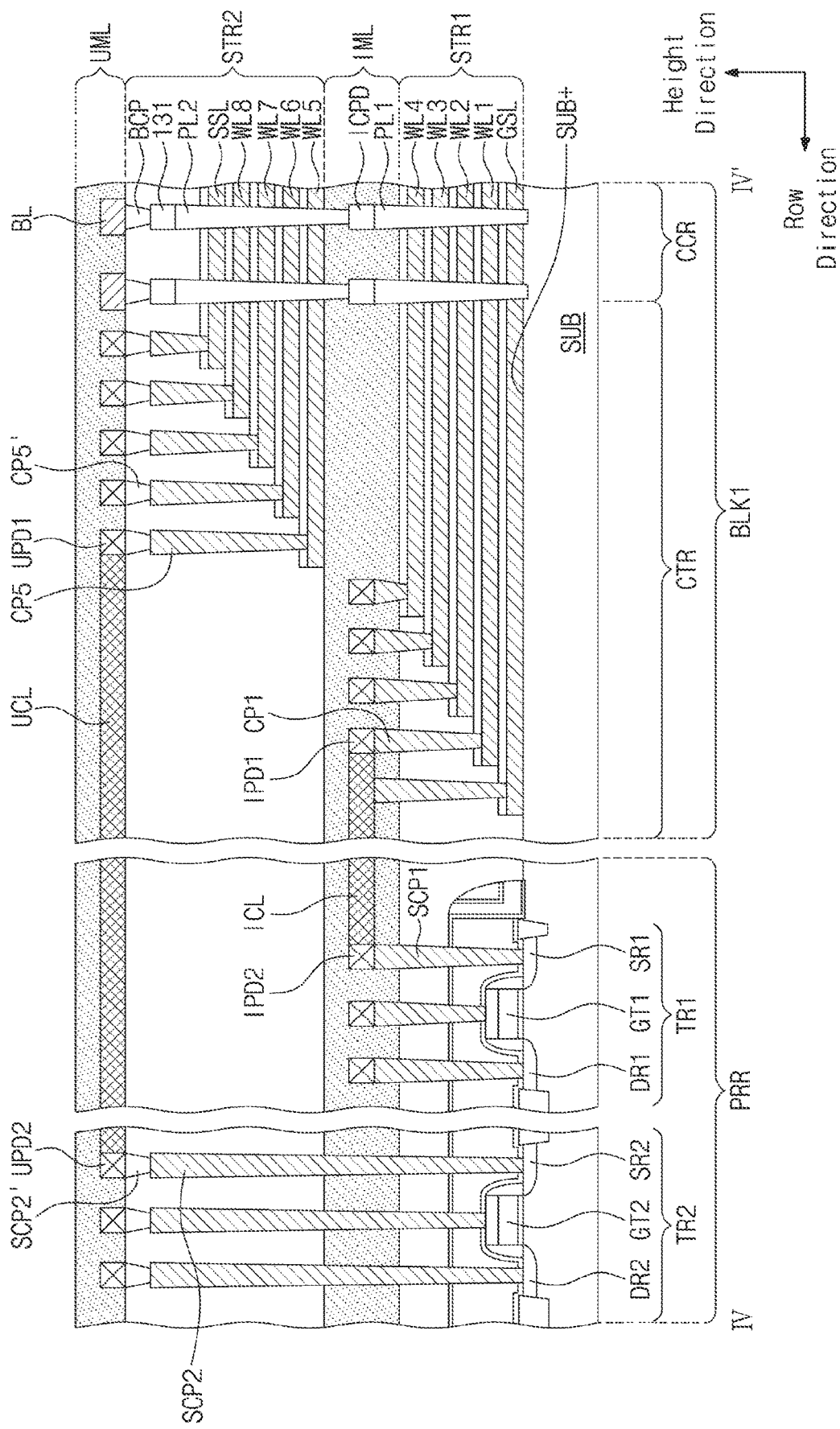
FIG. 4 is a sectional view of a nonvolatile memory device of FIG. 3 taken along a cross-sectional view line IV-IV'.

Word lines (i.e., DWL2 and WL5 to WL8) or the bit lines BL1 and BL2 connected with the second memory structure STR2 may be connected with the peripheral circuit 120 through the same upper metal layer (not illustrated, shown in FIG. 4). For example, the upper metal layer may include upper pads respectively corresponding to lines of the second memory structure STR2. Conductive lines for connecting the upper pads and the peripheral circuit 120 may be provided in the upper metal layer.

As described above, as word lines connected with the first memory structure STR1 and word lines connected with the second memory structure STR2 are connected with the peripheral circuit 120 through different layers, the complexity of the layer associated with each line may be reduced.

In some example embodiments, the first and second memory structures STR1 and STR2 of the first memory block BLK1 may be managed as different memory blocks. For example, an external device (e.g., a memory controller) may manage the first and second memory structures STR1 and STR2 by using different block addresses. That is, the external device may access the first memory structure STR1 based on a first block address and may access the second memory structure STR2 based on a second block address. Alternatively, the first and second memory structures STR1 and STR2 of the first memory block BLK1 may be managed as different sub-memory blocks.

Although not illustrated in FIG. 2, each of the first and second memory structures STR1 and STR2 may include a ground selection line, a plurality of word lines, and a string selection line, and, as described above, may be managed as a different memory block.

Figure 3:
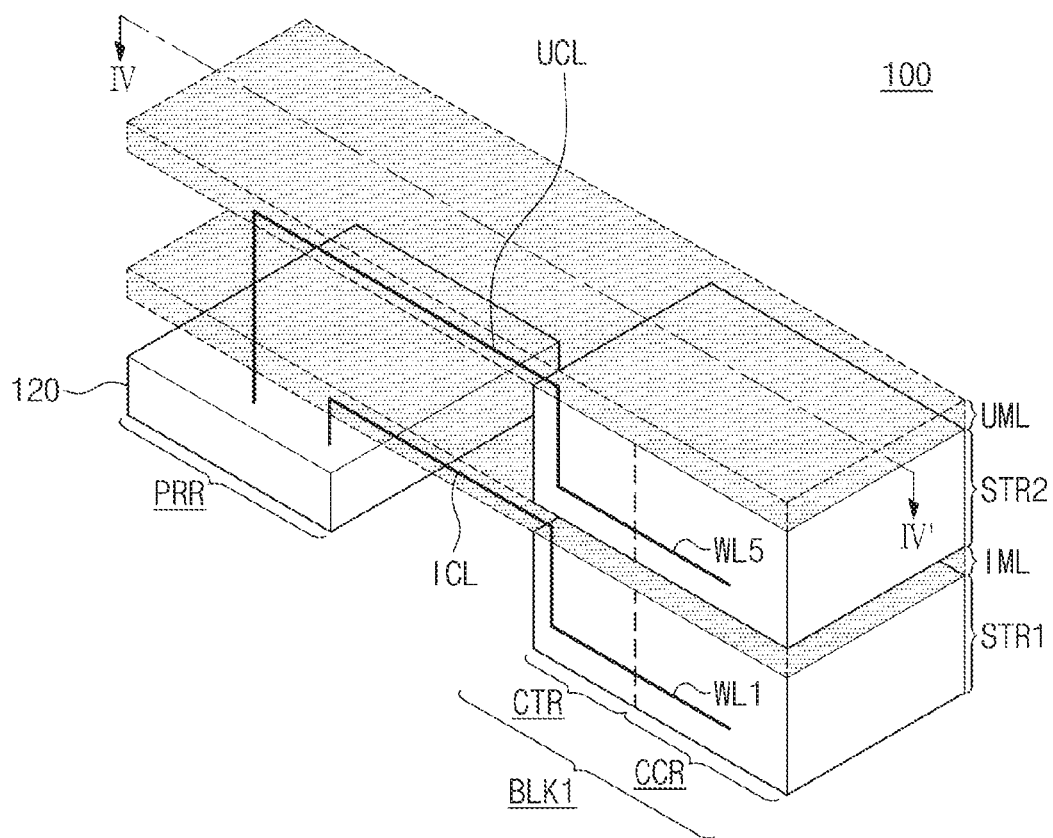
FIG. 3 is a conceptual diagram for describing a three-dimensional structure of a nonvolatile memory device of FIG. 1.

FIG. 3 is a conceptual diagram for describing a three-dimensional structure of a nonvolatile memory device of FIG. 1. A three-dimensional structure of the nonvolatile memory device 100 is conceptually illustrated in FIG. 3. To describe the technical idea of the inventive concepts easily, some example embodiments of the inventive concepts will be described with respect to the first memory block BLK1, but the inventive concepts is not limited thereto.

Referring to FIGS. 1 to 3, the nonvolatile memory device 100 may include the first memory block BLK1 and the peripheral circuit 120. The first memory block BLK1 may have three-dimensional structures that are stacked in a direction (i.e., a height direction) perpendicular to the substrate (not illustrated) along the row direction and the column direction.

The first memory block BLK1 may include the first memory structure STR1 and the second memory structure STR2. As shown in at least FIG. 4 and FIG. 15, the first and second memory structures STR1 and STR2 may each have a three-dimensional structure. The three-dimensional structure of the first memory structure STR1 (also referred to herein as a first three-dimensional structure) may be different from the three-dimensional structure of the second memory structure STR2 (also referred to herein as a second three-dimensional structure). The first memory structure STR1 may include lines (e.g., the ground selection line GSL, a plurality of word lines WL, etc.) stacked in the direction perpendicular to the substrate. That is, the first memory structure STR1 may be provided on the substrate and may have a three-dimensional structure.

The second memory structure STR2 may be formed over the first memory structure STR1. For example, the inter-metal layer IML may be formed over ("on") the first memory structure STR1, and the second memory structure STR2 may be formed over the inter-metal layer IML. The first and second memory structures STR1 and STR2 may be electrically connected to each other through the inter-metal layer IML. In detail, the first and second memory structures STR1 and STR2 may be electrically connected to each other through the intermediate connection pads of the inter-metal layer IML.

Each of the first and second memory structures STR1 and STR2 may include a cell core region CCR and a contact region CTR. The cell core region CCR may indicate a region including a plurality of cell transistors (or a plurality of pillars), and the contact region CTR may indicate a region including contact plugs connected with the ground selection line, the word lines, or the string selection lines connected with the cell core region CCR.

For example, the first memory cell MC1 (refer to FIG. 2) included in the cell core region CCR of the first memory structure STR1 may be connected with the first word line WL1. The first word line WL1 may extend into the contact region CTR along the row direction. A contact plug that is electrically connected with the first word line WL1 may be provided in the contact region CTR. The fifth memory cell MC5 (refer to FIG. 2) included in the cell core region CCR of the second memory structure STR2 may be connected with the fifth word line WL5. The fifth word line WL5 may extend into the contact region CTR along the row direction. A contact plug that is electrically connected with the fifth word line WL5 may be provided in the contact region CTR.

The first and second memory structures STR1 and STR2 may be connected with the peripheral circuit 120 through the string selection lines SSL, the word lines WL, and the ground selection lines GSL. In some example embodiments, the first memory structure STR1 may be connected with the peripheral circuit 120 through the inter-metal layer IML, and the second memory structure STR2 may be connected with the peripheral circuit 120 through an upper metal layer UML.

For example, the cell core region CCR of the first memory structure STR1 may be electrically connected with the peripheral circuit 120 placed in a peripheral circuit region PRR through the contact region CTR of the first memory structure STR1 and the inter-metal layer IML, and the cell core region CCR of the second memory structure STR2 may be electrically connected with the peripheral circuit 120 through the contact region CTR of the second memory structure STR2 and the upper metal layer UML.

In some example embodiments, a first contact plug electrically connected with the first word line WL1 of the first memory structure STR1 may be connected with an intermediate pad of the inter-metal layer IML, and the intermediate pad may be connected with the peripheral circuit 120 disposed in the peripheral circuit region PRR through an intermediate conductive line ICL. In contrast, a fifth contact plug electrically connected with the fifth word line WL5 of the second memory structure STR2 may be connected with an upper pad of the upper metal layer UML, and the upper pad may be connected with the peripheral circuit 120 through an upper conductive line UCL.

In some example embodiments, and as shown in at least FIG. 4, the upper metal layer UML may be formed over ("on") the second memory structure STR2. The upper metal layer UML may be a layer for providing bit lines BL connected with the first memory block BLK1.

As described above, the first memory block BLK1 may include the multi-stacked first and second memory structures STR1 and STR2, each line of the first memory structure STR1 may be connected with the peripheral circuit 120 through the inter-metal layer IML, and each line of the second memory structure STR2 formed over the first memory structure STR1 may be connected with the peripheral circuit 120 through the upper metal layer UML.

FIG. 4 is a sectional view of the nonvolatile memory device 100 of FIG. 3 taken along a line IV-IV'. For brevity of illustration, a part of the first memory block BLK1 and a part of the peripheral circuit 120 are illustrated in FIG. 4. Also, for brevity of illustration, it is assumed that the first memory block BLK1 includes the ground selection line GSL, the first to eighth word lines WL1 to WL8, and the string selection line SSL. However, the inventive concepts may not be limited thereto. For example, as illustrated in FIG. 2, the first memory block BLK1 may further include an additional word line, an additional dummy word line, an additional ground selection line, or an additional string selection line, etc. For a brief description, components that are the same as the above-described components are not described.

Referring to FIG. 4, the first memory structure STR1 on the substrate SUB may include the ground selection line GSL and the first to fourth word lines WL1 to WL4 stacked on the substrate SUB in a direction (i.e., a height direction) perpendicular to a top surface SUBt of the substrate SUB and a first pillar PL1 formed on the substrate SUB. As referred to herein, at least the first to fourth word lines WL1 to WL4 may be collectively referred to herein as a plurality of first word lines. As shown in FIG. 4, the first pillar PL1 extends through the plurality of first word lines (e.g., WL1 to WL4). The first pillar PL1 may be provided in the cell core region CCR of the first memory structure STR1 and may be provided to penetrate the ground selection line GSL and the first to fourth word lines WL1 to WL4 stacked in the direction (i.e., the height direction) perpendicular to the substrate SUB. The first pillar PL1 may be electrically connected with an intermediate connection pad ICPD of the inter-metal layer IML.

As shown in FIG. 4, the inter-metal layer IML is on the first memory structure STR1. As further shown in FIG. 4, a plurality of intermediate pads (e.g., IPD1) of the inter-metal layer IML may be connected with separate, respective first word lines (e.g., WL1 to WL4) of the first memory structure STR1.

In some example embodiments, the first memory structure STR1 may further include a plurality of pillars similar to the first pillar PL1, and the plurality of pillars may be electrically connected with corresponding intermediate connection pads in the inter-metal layer IML. In some example embodiments, the intermediate connection pads of the inter-metal layer IML may be configured to electrically connect a plurality of pillars of the first memory structure STR1 and a plurality of pillars of the second memory structure STR2.

Figure 15:
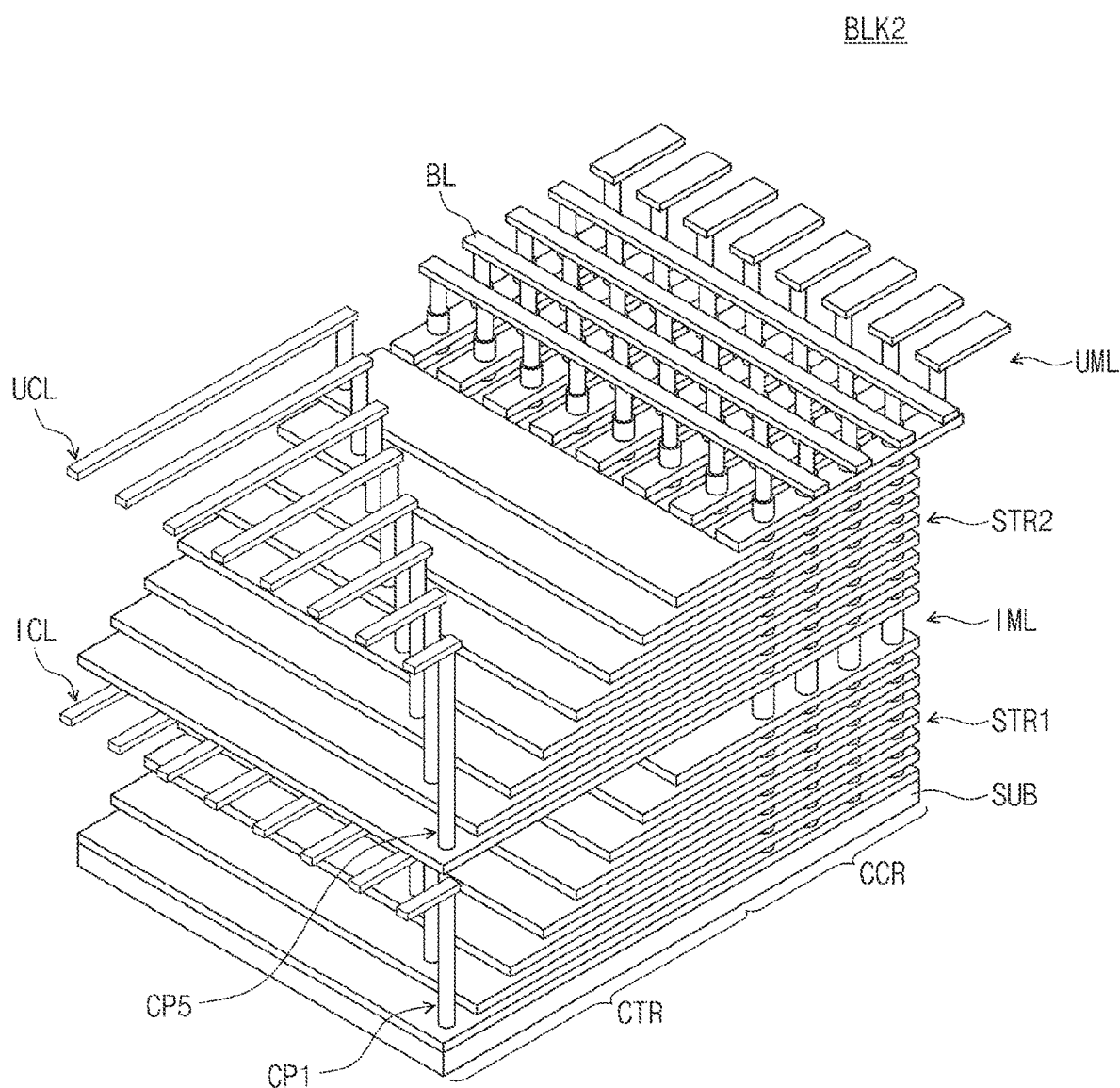
FIGS. 15, 16, and 17 are section views of memory blocks according to some example embodiments of the inventive concepts.

The contact region CTR of the first memory structure STR1 may be a region for providing contact plugs for the ground selection line GSL and the first to fourth word lines WL1 to WL4. For example, a first contact plug CP1 that is connected with the first word line WL1 extending in the row direction from the cell core region CCR may be provided in the contact region CTR. The first contact plug CP1 may be configured to electrically connect the first word line WL1 and a first intermediate pad IPD1 of the inter-metal layer IML. As shown in FIGS. 4 and 15, the first memory structure STR1 may include a plurality of first contact plugs (e.g., CP1), where the first contact plugs (e.g., CP1) are configured to electrically couple separate, respective first word lines (e.g., WL1 to WL4) of the first memory structure STR1 to separate, respective intermediate pads (e.g., IPD1) of the intermediate pads of the inter-metal layer IML. As shown in FIGS. 4 and 15, the plurality of first contact plugs (e.g., CP1) may be connected with separate, respective intermediate conductive lines ICL of the plurality of intermediate conductive lines ICL of the inter-metal layer IML.

The first intermediate pad IPD1 of the inter-metal layer IML may be connected with a second intermediate pad IPD2 through the intermediate conductive line ICL. The second intermediate pad IPD2 may be connected with a first source region SR1 of a first transistor TR1 provided in the peripheral circuit region PRR through a first source contact plug SCP1. The first transistor TR1 may be a transistor included in any one of components included in the peripheral circuit 120. Restated, the peripheral circuit 120 may include the first transistor TR1.

That is, the first intermediate pad IPD1, the intermediate conductive line ICL, and the second intermediate pad IPD2 may be included in the inter-metal layer IML, and the first word line WL1 of the first memory structure STR1 may be connected with the peripheral circuit 120 through the inter-metal layer IML.

As shown in FIG. 4, and as further shown in FIG. 15, the inter-metal layer IML includes a plurality of intermediate conductive lines ICL, where the intermediate conductive lines ICL are connected with separate, respective intermediate pads (e.g., IPD1) of a plurality of intermediate pads of the inter-metal layer IML. As shown in at least FIG. 4 and FIG. 15, the intermediate conductive lines ICL may be connected with separate, respective first word lines (e.g., WL1 to WL4) of the first memory structure STR1.

As shown in FIG. 4, the peripheral circuit 120 may be on the substrate SUB. Furthermore, as shown in FIG. 4, the inter-metal layer IML includes a plurality of intermediate conductive lines ICL electrically coupling the plurality of first word lines (e.g., WL1 to WL4) of the first memory structure STR1 to the peripheral circuit 120.

The second memory structure STR2 may include the fifth to eighth word lines WL5 to WL8 and the string selection line SSL stacked over ("on") the first memory structure STR1 in the direction perpendicular to the top surface SUBt of the substrate SUB and a second pillar PL2. For example, the inter-metal layer IML may be formed over ("on") the first memory structure STR1, and the fifth to eighth word lines WL5 to WL8 and the string selection line SSL may be stacked over ("on") the inter-metal layer IML. For example, the second pillar PL2 may be provided in the cell core region CCR of the second memory structure STR2 and may be provided to penetrate the fifth to eighth word lines WL5 to WL8 and the string selection line SSL stacked over the inter-metal layer IML in a vertical direction. As described above, the second pillar PL2 may be electrically connected with the first pillar PL1 through an intermediate connection pad ICPD of the inter-metal layer IML. As referred to herein, at least the fifth to eighth word lines WL5 to WL8 may be collectively referred to herein as a plurality of second word lines. As shown in FIG. 4, the second pillar PL2 extends through the plurality of second word lines (e.g., WL5 to WL8).

The second pillar PL2 may be connected with a bit line BL through a drain 131 and a bit line contact plug BCP. The bit line BL may be provided ("included") in the upper metal layer UML, and the bit line BL may be electrically coupled to the second pillar PL2. In some example embodiments, the first and second pillars PL1 and PL2 may be electrically connected ("electrically coupled") with each other through the intermediate connection pad ICPD. Restated, the intermediate connection pad ICPD may be configured to electrically couple the first pillar PL1 and the second pillar PL2 to each other. Accordingly, the first and second pillars PL1 and PL2 may be electrically connected with the bit line BL. That is, one cell string may be formed through the first and second pillars PL1 and PL2 and the intermediate connection pad ICPD. Thus, where the upper metal layer UML includes multiple bit lines BL, for example as shown in at least FIG. 4, the bit lines BL may be electrically coupled with both the first and second memory structures STR1 and STR2.

As shown in at least FIG. 4, the first memory structure STR1 may include multiple first pillars PL1 extending through the first word lines (e.g., WL1 to WL4) of the first memory structure STR1 on the substrate SUB, the inter-metal layer IML may include a plurality of intermediate connection pads ICPD connected with separate, respective first pillars PL1, the second memory structure STR2 may include multiple second pillars PL2 extending through the second word lines (e.g., WL5 to WL8) of the second memory structure STR2 on the substrate SUB. The second pillars PL2 may be connected with separate, respective intermediate connection pads ICPD of the inter-metal layer IML.

In some example embodiments, the second memory structure STR2 may further include a plurality of pillars similar to the second pillar PL2. The plurality of pillars may be electrically connected with corresponding intermediate connection pads in the inter-metal layer IML and may be connected with corresponding bit lines through drains and contact plugs.

The contact region CTR of the second memory structure STR2 may be a region for providing contact plugs for the fifth to eighth word lines WL5 to WL8 and the string selection line SSL. For example, contact plugs CP5 and CP5' that are connected with the fifth word line WL5 extending in the row direction from the cell core region CCR may be provided in the contact region CTR. The fifth contact plugs CP5 and CP5' may be configured to electrically connect the fifth word line WL5 and a first upper pad UPD1. As shown in at least FIG. 4, a plurality of upper pads (e.g., UPD1) of the upper metal layer UML may be connected with separate, respective second word lines (e.g., WL5 to WL8) of the second word lines of the second memory structure STR2.

As shown in FIGS. 4 and 15, the second memory structure STR2 may include a plurality of second contact plugs (e.g., CP5), where the second contact plugs (e.g., CP5) are configured to electrically couple separate, respective second word lines (e.g., WL5 to WL8) of the second memory structure STR2 to separate, respective upper pads (e.g., UPD1) of the upper pads of the upper metal layer UML. As shown in FIGS. 4 and 15, the plurality of second contact plugs (e.g., CP5) may be connected with separate, respective upper conductive lines UCL of the plurality of upper conductive lines UCL of the upper metal layer UML. As shown in at least FIGS. 4 and 15, the upper conductive lines UCL may be connected with separate, respective second word lines (e.g., WL5 to WL8) of the second memory structure STR2.

In some example embodiments, the first upper pad UPD1 may be included in the upper metal layer UML. In other words, a layer including the first upper pad UPD1 connected with the fifth word line WL5 of the second memory structure STR2 may be different from a layer including the first intermediate pad IPD1 connected with the first word line WL1 of the first memory structure STR1.

As shown in FIG. 4, and as further shown in FIG. 15, the upper metal layer UML includes a plurality of upper conductive lines UCL, where the upper conductive lines UCL are connected with separate, respective upper pads (e.g., UPD1) of a plurality of upper pads of the upper metal layer UML. As shown in FIG. 4, the upper metal layer UML includes a plurality of upper conductive lines UCL electrically coupling the plurality of second word lines (e.g., WL5 to WL8) of the second memory structure STR2 to the peripheral circuit 120.

The first upper pad UPD1 of the upper metal layer UML may be connected with a second upper pad UPD2 through the upper conductive line UCL. The upper conductive line UCL may be a conductive material included in the upper metal layer UML. The second upper pad UPD2 may be connected with a second source region SR2 of a second transistor TR2 provided in the peripheral circuit region PRR through a second source contact plugs SCP2 and SCP2'. That is, the first upper pad UPD1, the upper conductive line UCL, and the second upper pad UPD2 may be included in the upper metal layer UML. Accordingly, the fifth word line WL5 of the second memory structure STR2 may be connected with the peripheral circuit 120 through the upper metal layer UML. As shown in FIG. 4, the peripheral circuit 120 may include the second transistor TR2.

In some example embodiments, as illustrated in the peripheral circuit region PRR of FIG. 4, the first transistor TR1 may be connected with an intermediate pad of the inter-metal layer IML, and the second transistor TR2 may be connected with an upper pad of the upper metal layer UML. For example, each of the first source region SR1, a first gate GT1, and a first drain region DR1 of the first transistor TR1 may be connected with an intermediate peripheral pad included in the inter-metal layer IML through a corresponding contact plug. Alternatively, each of the second source region SR2, a second gate GT2, and a second drain region DR2 of the second transistor TR2 may be connected with an upper peripheral pad included in the upper metal layer UML through a corresponding contact plug. That is, the peripheral circuit 120 formed in the peripheral circuit region PRR may be connected with the first memory block BLK1 through the inter-metal layer IML or the upper metal layer UML.

As shown in at least FIG. 3 and FIG. 4, the peripheral circuit PRR is connected with both the intermediate conductive lines ICL of the inter-metal layer IML and the upper conductive lines UCL of the upper metal layer UML. It will be understood, as shown in at least FIG. 15, that the device shown in FIG. 4 may include a plurality of intermediate conductive lines ICL and a plurality of upper conductive lines UCL.

In some example embodiments, as in the first word lines WL1, each of the ground selection line GSL and the second to fourth word lines WL2 to WL4 may be connected with a contact plug provided in the contact region CTR, and the contact plug may be connected with an intermediate pad of the inter-metal layer IML. Although not illustrated in FIG. 4, the intermediate pad may be connected with a corresponding component (or element) of the peripheral circuit 120 through a conductive line(s) included in the inter-metal layer IML.

In some example embodiments, as in the fifth word lines WL5, each of the sixth to eighth word lines WL6 to WL8 and the string selection line SSL may be connected with a contact plug provided in the contact region CTR, and the contact plug may be connected with an upper pad of the upper metal layer UML. Although not illustrated in FIG. 4, the upper pad may be connected with a corresponding upper peripheral pad through a conductive line(s) provided in the upper metal layer UML.

As described above, the first memory block BLK1 according to some example embodiments of the inventive concepts may include the first memory structure STR1 and the second memory structure STR2 stacked in the direction perpendicular to the substrate SUB. The first and second memory structures STR1 and STR2 may be electrically connected to each other through the inter-metal layer IML. Lines (e.g., a ground selection line, a word line, etc.) included in the first memory structure STR1 may be connected with the peripheral circuit 120 through the inter-metal layer IML, and lines (e.g., a word line, a string selection line, etc.) included in the second memory structure STR2 may be connected with the peripheral circuit 120 through the upper metal layer UML. According to the above description, since conductive lines for connecting the first memory block BLK1 and the peripheral circuit 120 are distributed to different layers, the complexity of the layout of the nonvolatile memory device 100 decreases.

FIGS. 5A to 5D are views for clearly describing a structure of the first memory block BLK1 of FIG. 4. For brevity of illustration and convenience of description, components that are unnecessary to describe the structure of the first memory block BLK1 or a description associated with the components is omitted. Also, to prevent the technical idea of the inventive concepts from being ambiguous, a description associated with a detailed process is omitted.

Figure 5A:
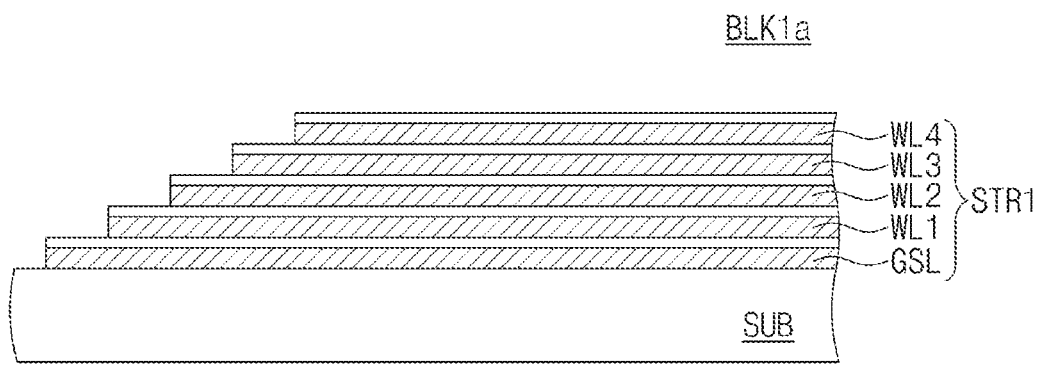
FIGS. 5A, 5B, 5C, and 5D are views for clearly describing a structure of a first memory block of FIG. 4.

Referring to FIGS. 4 and 5A, in a first memory block BLK1a, the ground selection line GSL and the first to fourth word lines WL1 to WL4 may be stacked over the substrate SUB in a direction perpendicular to the substrate SUB. In some example embodiments, the ground selection line GSL and the first to fourth word lines WL1 to WL4 may be included in the first memory structure STR1.

Figure 5B:
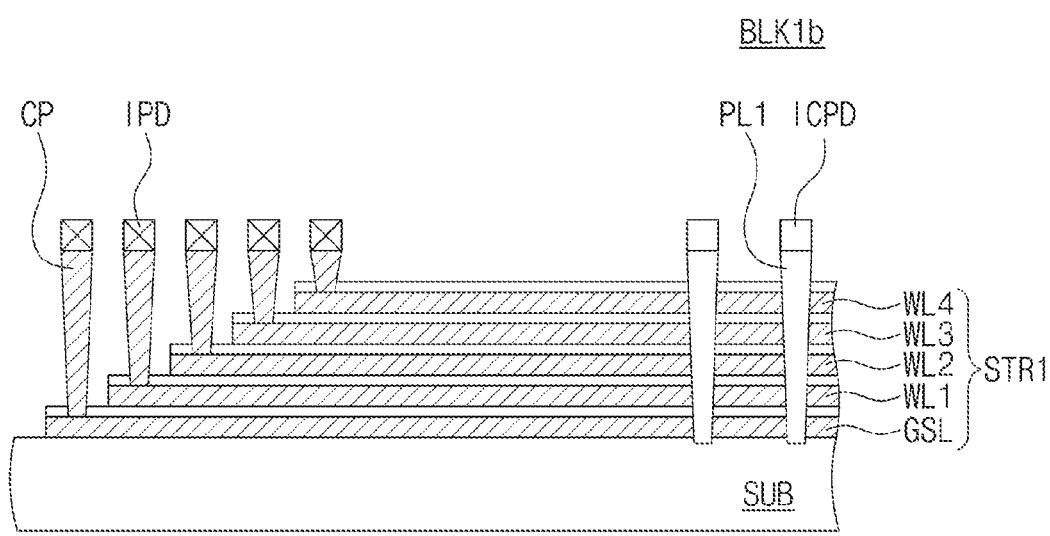

Referring to FIGS. 4 and 5B, contact plugs CP respectively connected with the ground selection line GSL and the first to fourth word lines WL1 to WL4 may be formed in the contact region CTR of the first memory structure STR1 in a first memory block BLK1b, and first pillars PL1 penetrating the ground selection line GSL and the first to fourth word lines WL1 to WL4 may be formed in the cell core region CCR of the first memory structure STR1 in the first memory block BLK1b. Intermediate pads IPD connected with one ends of the contact plugs CP may be formed, and intermediate connection pads ICPD connected with one ends of the first pillars PL1 may be formed.

Figure 5C:
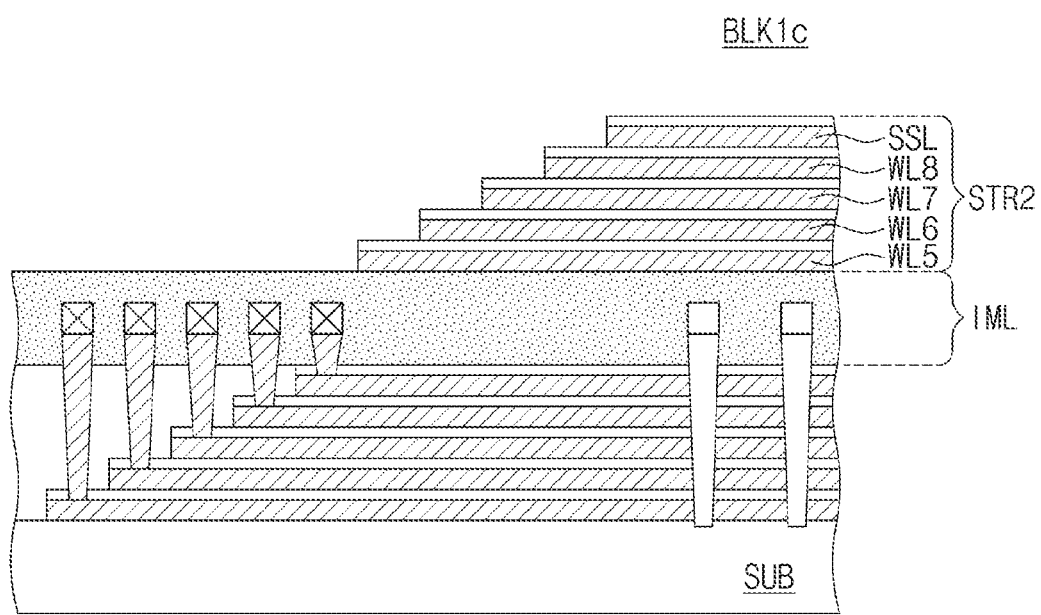

Referring to FIGS. 4 and 5C, in a first memory block BLK1c, the intermediate pads IPD and the intermediate connection pads ICPD may be included in the inter-metal layer IML described above. In some example embodiments, in the inter-metal layer IML, the remaining region other than the intermediate pads IPD and the intermediate connection pads ICPD may be filled with an insulating material.

The fifth to eighth word lines WL5 to WL8 and the string selection line SSL may be formed over the inter-metal layer IML in the direction perpendicular to the substrate SUB. The fifth to eighth word lines WL5 to WL8 and the string selection line SSL may be included in the second memory structure STR2.

Figure 5D:
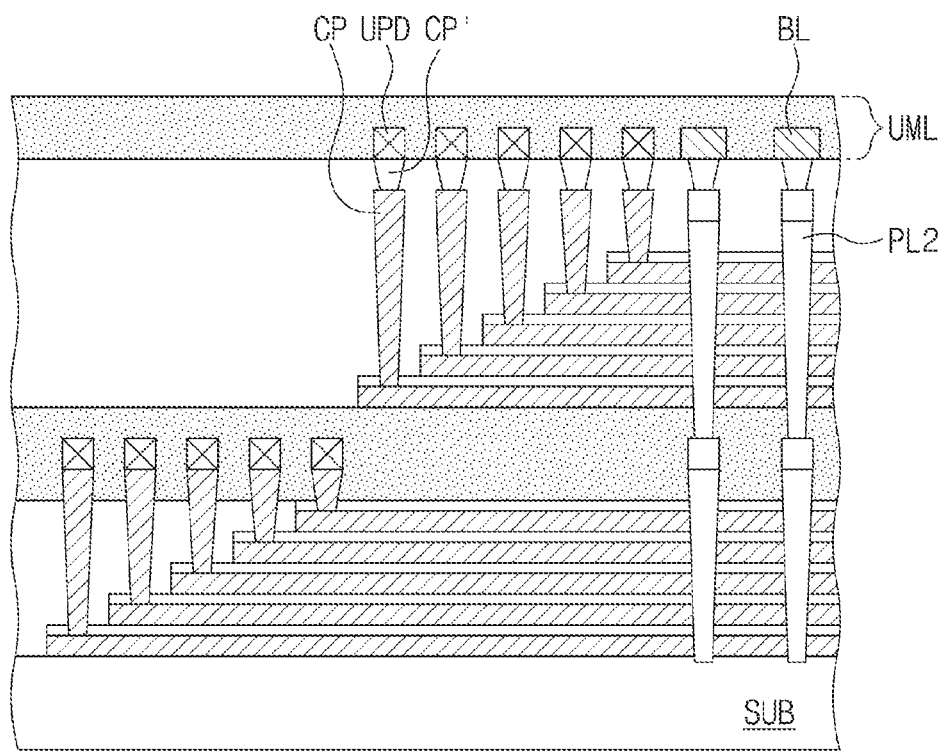

Referring to FIGS. 4 and 5D, contact plugs CP and CP' respectively connected with the fifth to eighth word lines WL5 to WL8 and the string selection line SSL may be formed in the contact region CTR of the second memory structure STR2 in a first memory block BLK1d, and second pillars PL2 penetrating the fifth to eighth word lines WL5 to WL8 and the string selection line SSL may be formed in the cell core region CCR of the second memory structure STR2 in the first memory block BLK1d.

Upper pads UPD connected with one ends of the contact plugs CP' may be formed. That is, each of the fifth to eighth word lines WL5 to WL8 and the string selection line SSL may be electrically connected with a corresponding upper pad UPD through the contact plugs CP and CP'. The second pillars PL2 may be connected (e.g., electrically coupled) with bit lines BL provided in the upper metal layer UML through drains and contact plugs. In some example embodiments, the upper pads UPD and the bit lines BL may be provided in the same layer (i.e., a first metal-layer).

As described above, the first memory block BLK1 may have a multi-stacked structure. The multi-stacked structure may indicate a structure in which a plurality of memory structures are electrically connected with each other through a plurality of inter-metal layers. That is, the first memory block BLK1 may include a plurality of memory structures, and the plurality of memory structures may be connected with each other through intermediate connection layers. In some example embodiments, the plurality of memory structures of the first memory block BLK1 may be connected with the peripheral circuit 120 through different intermediate connection layers IML or through an upper metal layer UML placed on the uppermost side.

Below, structures of various memory blocks according to the technical idea of the inventive concepts will be described. However, the structures of memory blocks to be described below are only examples for describing the technical idea of the inventive concepts easily, and the inventive concepts is not limited thereto. Also, the terms "first", "second", etc. are used to distinguish embodiments of the inventive concepts clearly, but structures of memory blocks are not distinguished by the terms. For example, a structure of a new memory block may be suggested by combining a first memory block and a second memory block. For brevity of illustration and convenience of description, a detailed description associated with the same or similar components will not be repeated here.

Figure 6:
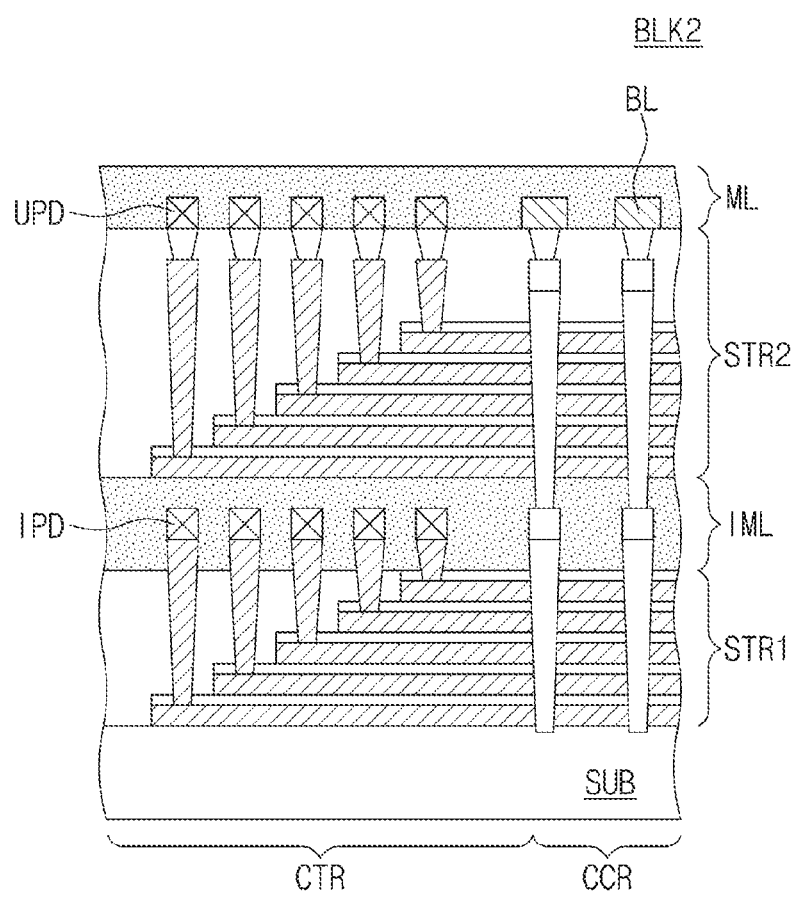
FIG. 6 is a sectional view illustrating a structure of a second memory block according to some example embodiments of the inventive concepts.

FIG. 6 is a sectional view illustrating a structure of a second memory block BLK2 according to the inventive concepts. Referring to FIG. 6, the second memory block BLK2 may include the first memory structure STR1 formed on the substrate SUB and the second memory structure STR2 formed over the first memory structure STR1.

For example, the first memory structure STR1 may include the ground selection line GSL and the first to fourth word lines WL1 to WL4 stacked in a direction perpendicular to the substrate SUB. The second memory structure STR2 may include the fifth to eighth word lines WL5 to WL8 and the string selection line SSL stacked over the inter-metal layer IML in the direction perpendicular to the substrate SUB. The first and second memory structures STR1 and STR2 may be electrically connected to each other through the inter-metal layer IML. The first and second memory structures STR1 and STR2 are described with reference to FIGS. 1 to 5, and thus, a detailed description thereof will not be repeated here.

Unlike the first memory block BLK1 of FIG. 4, the contact regions CTR of the first and second memory structures STR1 and STR2 of the second memory block BLK2 of FIG. 6 may be disposed to overlap each other on the substrate SUB. For example, the contact regions CTR of the first and second memory structures STR1 and STR2 of the first memory block BLK1 of FIG. 4 may be disposed not to overlap each other on the substrate SUB. In contrast, the contact regions CTR of the first and second memory structures STR1 and STR2 of the second memory block BLK2 of FIG. 6 may be disposed to overlap each other on the substrate SUB.

Since lines of the first memory structure STR1 are connected with the peripheral circuit 120 through the inter-metal layer IML and lines of the second memory structure STR2 are connected with the peripheral circuit 120 through the upper metal layer UML, even though the contact regions CTR of the first and second memory structures STR1 and STR2 of the second memory block BLK2 overlap each other on the substrate SUB, all the lines of the first and second memory structures STR1 and STR2 may be connected with the peripheral circuit 120. Also, the contact regions CTR of the first and second memory structures STR1 and STR2 of the second memory block BLK2 may overlap each other on the substrate SUB, and thus, the whole block size may decrease.

Figure 7:
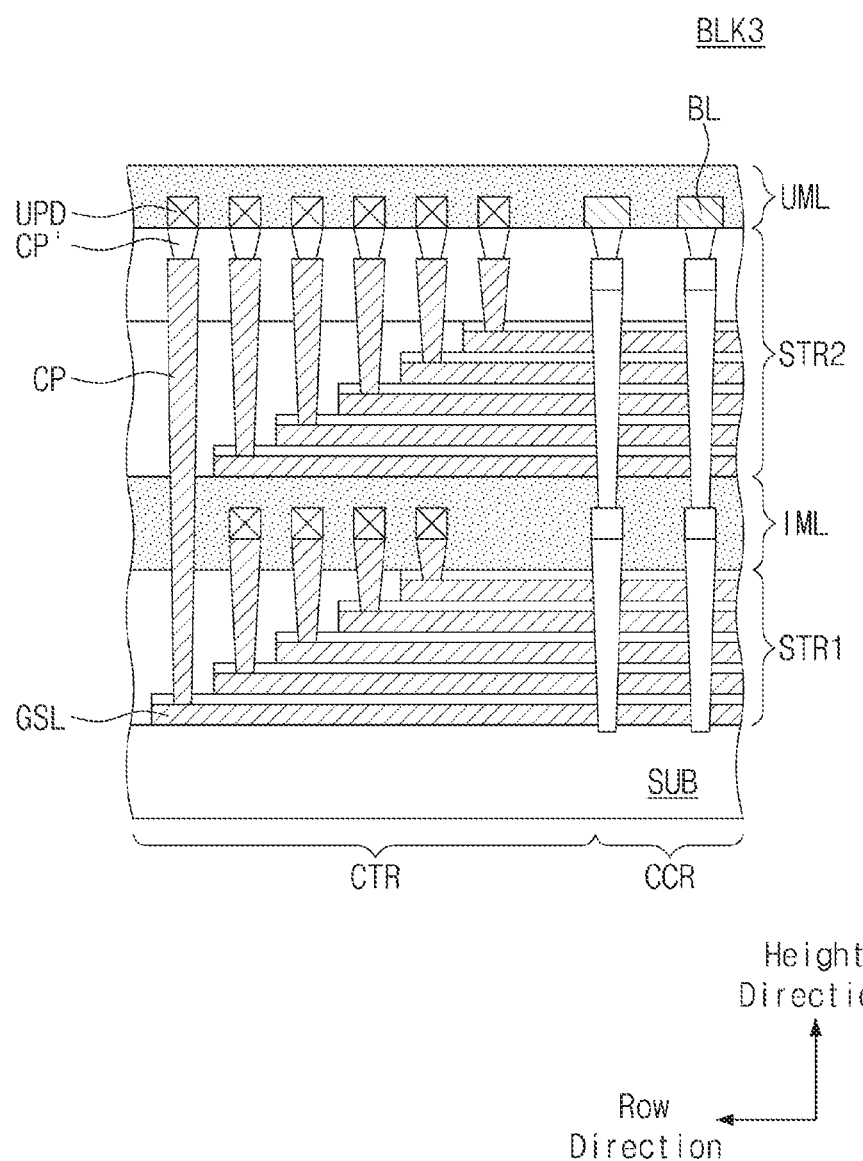
FIG. 7 is a sectional view illustrating a structure of a third memory block according to some example embodiments of the inventive concepts.

FIG. 7 is a sectional view illustrating a structure of a third memory block BLK3 according to the inventive concepts. Referring to FIG. 7, the third block BLK3 may include the first memory structure STR1 formed on the substrate SUB and the second memory structure STR2 formed over the first memory structure STR1. The first and second memory structures STR1 and STR2 may be electrically connected to each other through the inter-metal layer IML. The first and second memory structures STR1 and STR2 are described with reference to FIGS. 1 to 5, and thus, a detailed description thereof will not be repeated here.

The contact regions CTR of the first and second memory structures STR1 and STR2 of the third memory block BLK3 of FIG. 7 may be disposed to overlap each other on the substrate SUB. However, unlike the second memory block BLK2 of FIG. 2, a part (e.g., the ground selection line GSL) of lines of the first memory structure STR1 in the third memory block BLK3 of FIG. 7 may be connected with an upper pad UPD of the upper metal layer UML through contact plugs CP and CP'. In other words, some lines of the first memory structure STR1 may be connected with the peripheral circuit 120 through the upper metal layer UML, and the remaining lines thereof may be connected with the peripheral circuit 120 through the inter-metal layer IML.

In some example embodiments, a structure of a memory block according to the inventive concepts is not limited to the third memory block BLK3 illustrated in FIG. 7. For example, a part of ground selection lines, dummy word lines, or word lines of the first memory structure STR1 may be connected with the peripheral circuit 120 through the upper metal layer UML. A region or the area where the contact regions CTR of the first and second memory structures STR1 and STR2 overlap each other on the substrate SUB may vary with a kind or the number of lines connected with the upper metal layer UML.

Figure 8:
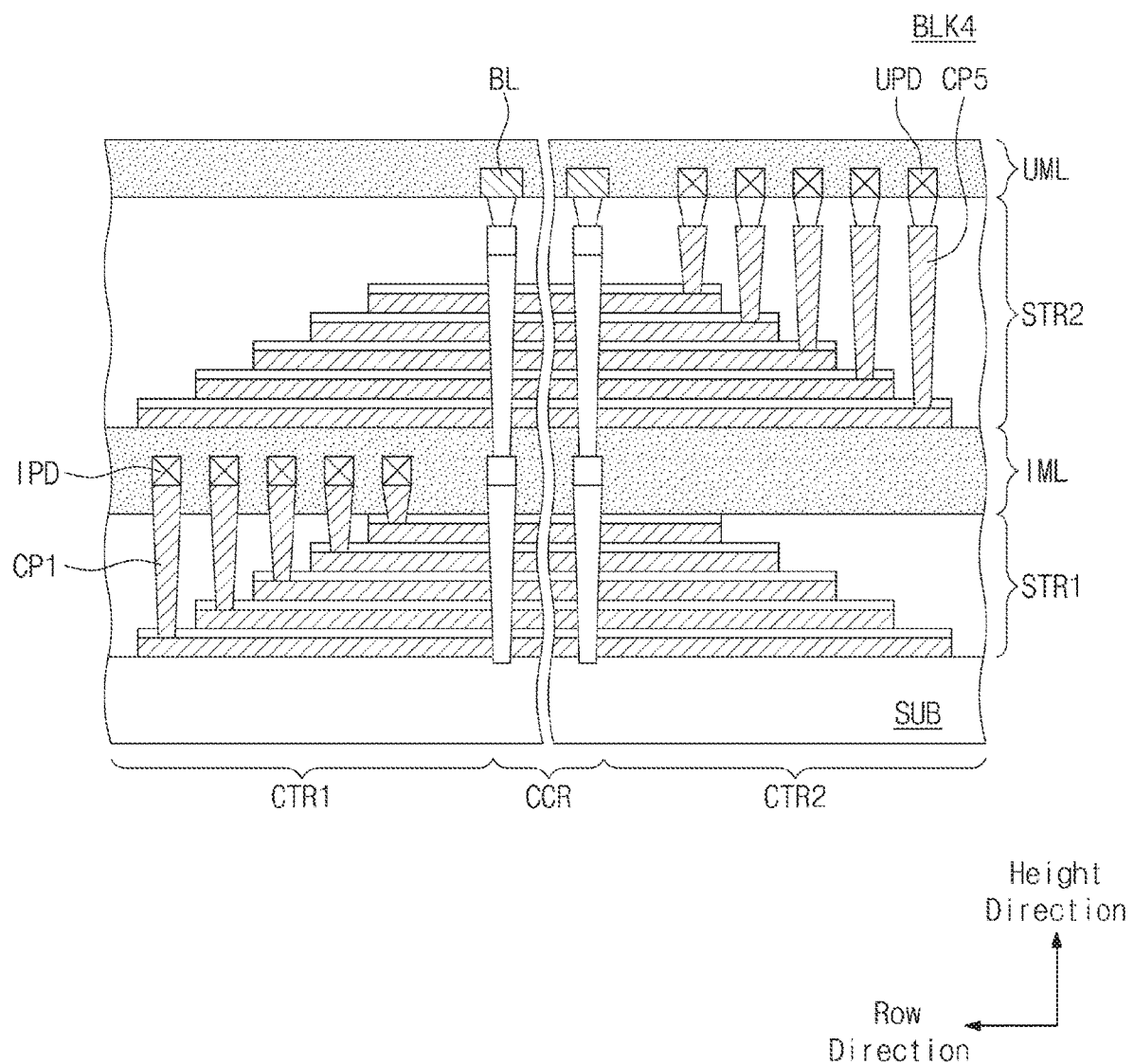
FIG. 8 is a sectional view illustrating a fourth memory block according to some example embodiments of the inventive concepts.

FIG. 8 is a sectional view illustrating a fourth memory block BLK4 according to the inventive concepts. Referring to FIG. 8, the fourth memory block BLK4 may include the first memory structure STR1 formed on the substrate SUB and the second memory structure STR2 formed over the first memory structure STR1. The first and second memory structures STR1 and STR2 may be electrically connected to each other through the inter-metal layer IML.

As shown in FIG. 8, each memory structure of the first and second memory structures STR1 and STR2 may include a first contact region CTR1, a second contact region CTR2, and a core region CCR. As shown, the first contact region CTR1 is on a first side of the core region CCR and the second contact region CTR2 is on a second side of the core region CCR, the second side being opposite to the first side. As shown in FIG. 8, the first contact plugs (e.g., CP1) are in the first contact region CTR1 of the first memory structure STR1 and the second contact plugs (e.g., CP5) are in the second contact region CTR2 of the second memory structure STR2.

Contact plugs for respective lines of the first memory structure STR1 may be formed in a first contact region CTR1 of the first memory structure STR1 of the fourth memory block BLK4, and contact plugs for respective lines of the second memory structure STR2 may be formed in a second contact region CTR2 of the second memory structure STR2. The first contact region CTR1 may indicate a region disposed on a first side of the cell core region CCR in the row direction, and the second contact region CTR2 may indicate a region disposed on a second side (opposite to the first side) of the cell core region CCR a direction opposite to the row direction. That is, the fourth memory block BLK4 may include the first and second contact regions CTR1 and CTR2 disposed on opposite sides with respect to the cell core region CCR.

As described above, the first memory structure STR1 may be connected with the peripheral circuit 120 through the inter-metal layer IML, and the second memory structure STR2 may be connected with the peripheral circuit 120 through an upper metal layer UML. In this case, the first memory structure STR1 of the fourth memory block BLK4 may be connected with the inter-metal layer IML (or the intermediate pads IPD) through contact plugs of the first contact region CTR1, and the second memory structure STR2 of the fourth memory block BLK4 may be connected with the upper metal layer UML (or the upper pads UPD) through contact plugs of the second contact region CTR2.

Figure 9:
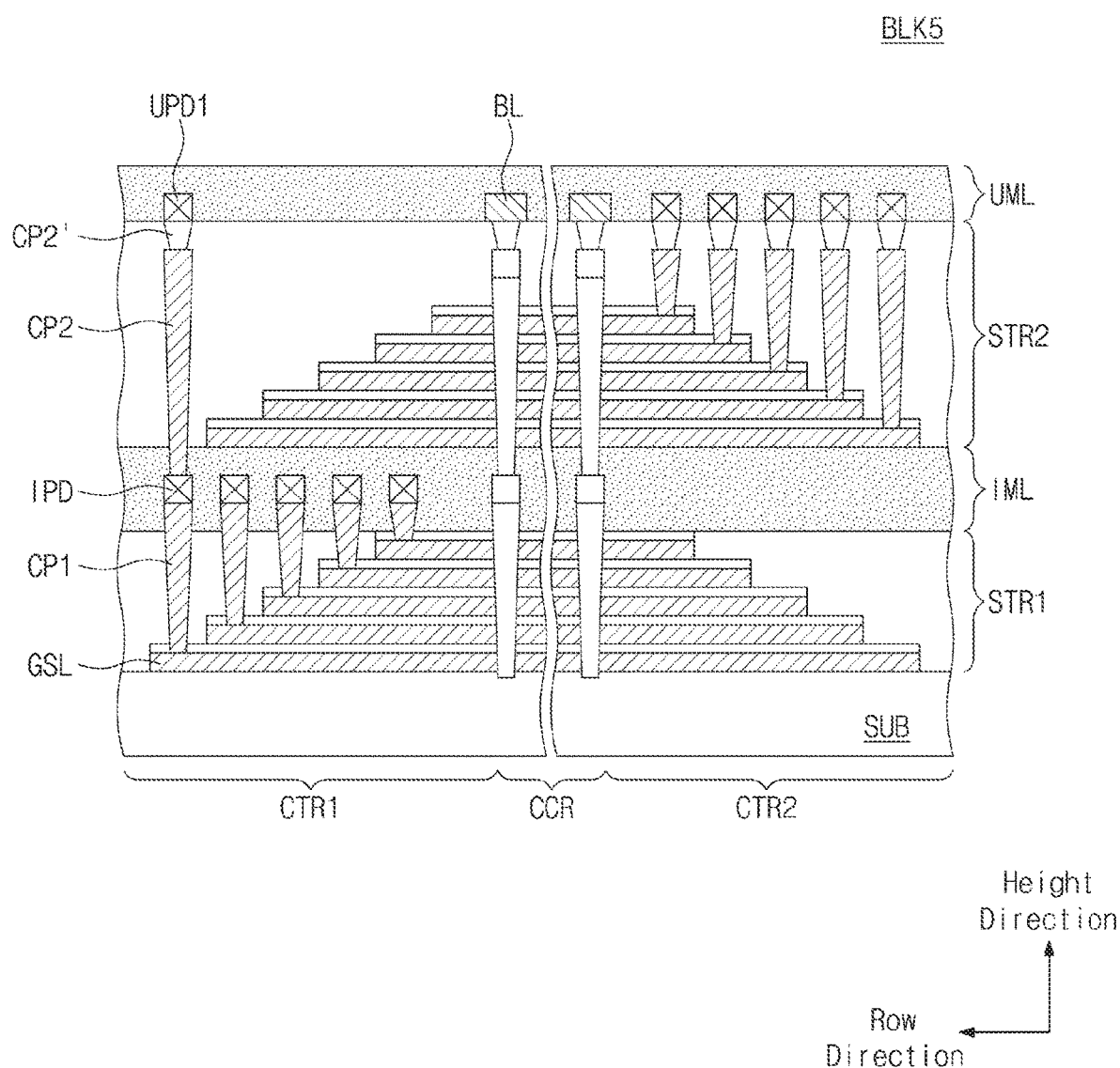
FIG. 9 is a sectional view illustrating a fifth memory block according to some example embodiments of the inventive concepts.

FIG. 9 is a sectional view illustrating a fifth memory block BLK5 according to the inventive concepts. Referring to FIG. 9, the fifth memory block BLK5 may include the first memory structure STR1 formed on the substrate SUB and the second memory structure STR2 formed over the first memory structure STR1. The first and second memory structures STR1 and STR2 may be electrically connected to each other through the inter-metal layer IML.

Since the fifth memory block BLK5 is similar to the fourth memory block BLK4 of FIG. 8, a difference between the fourth and fifth memory blocks BLK4 and BLK5 will be described. Unlike the fourth memory block BLK4 of FIG. 8, the fifth memory block BLK5 may be configured such that a part of lines of the first memory structure STR1 is connected with the peripheral circuit 120 through the upper metal layer UML. For example, the ground selection line GSL of the first memory structure STR1 may be connected with the peripheral circuit 120 through the upper metal layer UML. In this case, the ground selection line GSL may be connected with a first upper pad UPD1 (e.g., an additional upper pad) through a first contact plug CP1, an intermediate pad IPD, and second contact plugs CP2 and CP2'.

That is, some lines of the first memory structure STR1 of the fifth memory block BLK5 may be connected with the peripheral circuit 120 through the upper metal layer UML, and the remaining lines thereof may be connected with the peripheral circuit 120 through the inter-metal layer IML. In this case, to connect some lines and an upper pad of the upper metal layer UML, as illustrated in FIG. 9, a plurality of contact plugs and intermediate pads may be provided. However, the inventive concepts is not limited thereto. For example, to connect some lines and an upper pad of the upper metal layer UML, contact plugs CP and CP' may be provided like the third memory block BLK3 of FIG. 7.

Figure 10:
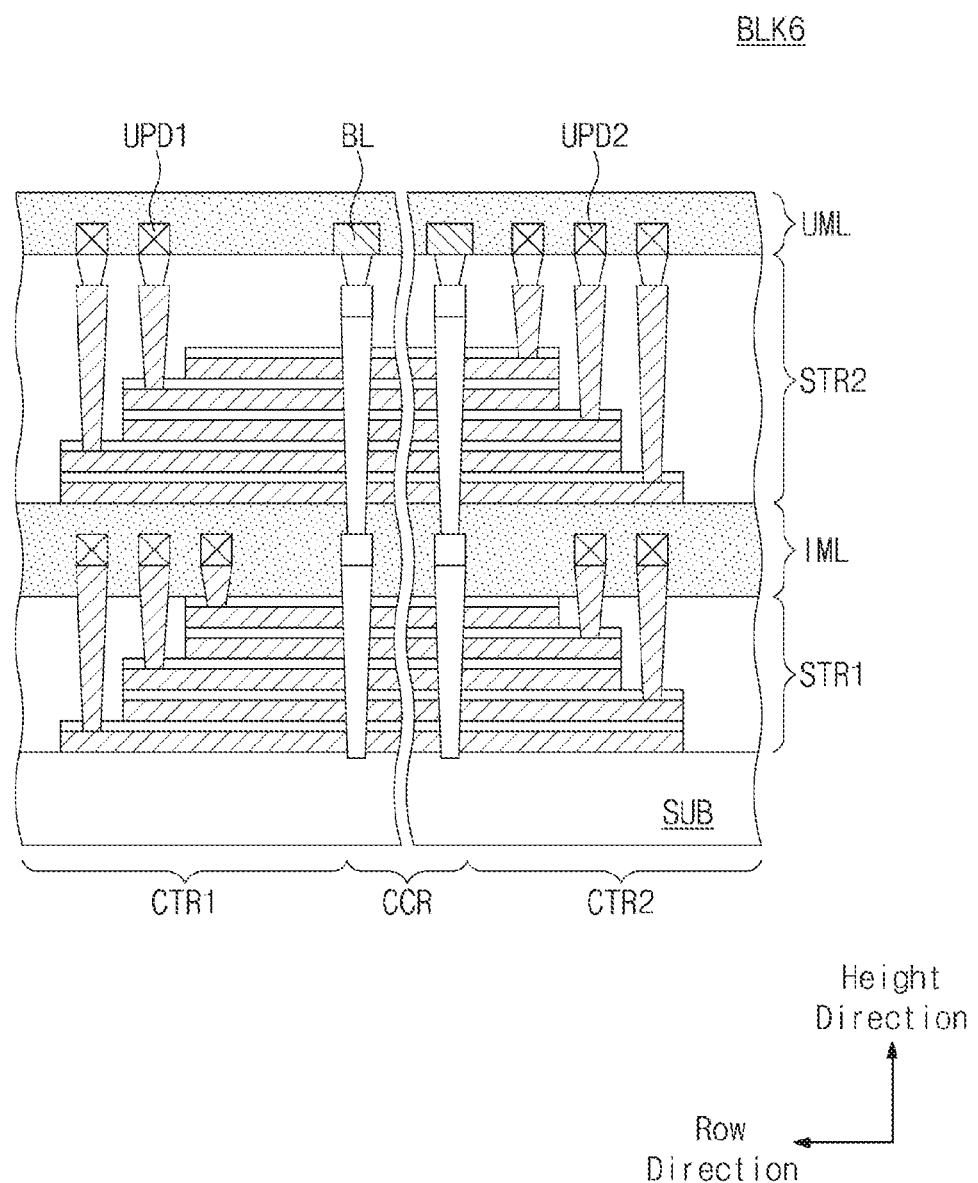
FIG. 10 is a sectional view illustrating a sixth memory block according to some example embodiments of the inventive concepts.

FIG. 10 is a sectional view illustrating a sixth memory block BLK6 according to the inventive concepts. Referring to FIG. 10, the sixth memory block BLK6 may include the first memory structure STR1 formed on the substrate SUB and the second memory structure STR2 formed over the first memory structure STR1. The first and second memory structures STR1 and STR2 may be electrically connected to each other through the inter-metal layer IML.

The first memory structure STR1 of the sixth memory block BLK6 may be connected with the peripheral circuit 120 through the inter-metal layer IML. In this case, some lines of the first memory structure STR1 are connected with intermediate pads of the inter-metal layer IML through contact plugs formed in the first contact region CTR1, and the remaining lines thereof are connected with intermediate pads of the inter-metal layer IML through contact plugs formed in the second contact region CTR2.

The second memory structure STR2 may be connected with the peripheral circuit 120 through the upper metal layer UML. In this case, some lines of the second memory structure STR2 are connected with upper pads of the upper metal layer UML through contact plugs formed in the first contact region CTR1, and the remaining lines thereof are connected with upper pads of the upper metal layer UML through contact plugs formed in the second contact region CTR2.

In some example embodiments, as illustrated in FIG. 10, lines corresponding to a (2n−1)-th stair of the first memory structure STR1 of the sixth memory block BLK6 may be connected with the inter-metal layer IML through contact plugs of the first contact region CTR1, and lines corresponding to a 2n-th stair may be connected with the inter-metal layer IML through contact plugs of the second contact region CTR2. Lines corresponding to a (2n−1)-th stair of the second memory structure STR2 of the sixth memory block BLK6 may be connected with the upper metal layer UML through contact plugs of the second contact region CTR2, and lines corresponding to a 2n-th stair may be connected with the upper metal layer UML through contact plugs of the first contact region CTR1.

In some example embodiments, in the first and second contact regions CTR1 and CTR2, a layer that is not connected with a contact plug may be formed to be overlapped with an upper layer thereof, thereby reducing the size of the first and second contact regions CTR1 and CTR2. For example, in the first contact region CTR1 of the first memory structure STR1, lines of first and third layers may be connected with contact plugs, and a line of a second layer may not be connected with a contact plug. In this case, the line of the second layer may be formed in the first contact region CTR1 of the first memory structure STR1 to have the same length as the line of the third layer, thereby reducing the whole length of the first contact region CTR1. Likewise, in the second contact region CTR2 of the first memory structure STR1 or in the first and second contact regions CTR1 and CTR2 of the second memory structure STR2, as described above, lengths of lines of specific layers may decrease, thereby reducing the whole size of the sixth memory block BLK6.

Figure 11:
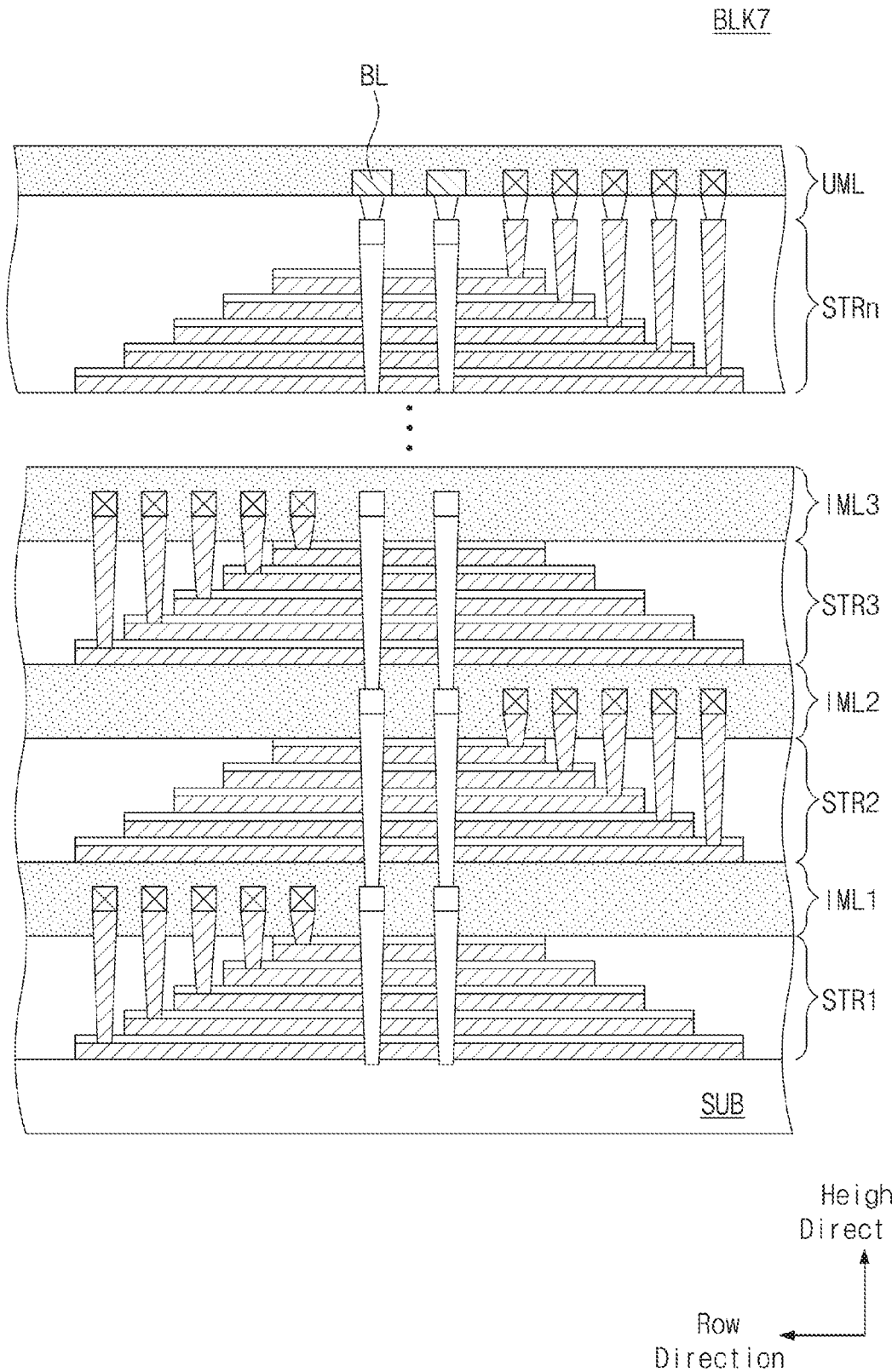
FIG. 11 is a sectional view illustrating a seventh memory block according to some example embodiments of the inventive concepts.

FIG. 11 is a sectional view illustrating a seventh memory block BLK7 according to the inventive concepts. Referring to FIG. 11, the seventh memory block BLK7 may include a plurality of memory structures STR1 to STRn. The plurality of memory structures STR1 to STRn may be connected with each other through a plurality of inter-metal layers IML1 to IMLn−1. The plurality of memory structures STR1 to STRn may be connected with the peripheral circuit 120 through the plurality of inter-metal layers IML1 to IMLn−1 and the upper metal layer UML. For example, the first memory structure STR1 may be connected with the peripheral circuit 120 through the first inter-metal layer IML1, the second memory structure STR2 may be connected with the peripheral circuit 120 through the second inter-metal layer IML2, and the third memory structure STR3 may be connected with the peripheral circuit 120 through the third inter-metal layer IML3. The n-th memory structure STRn placed on the uppermost side may be connected with the peripheral circuit 120 through the upper metal layer UML.

The multi-stacked structure illustrated in FIG. 11 is an example, and the inventive concepts are not limited thereto. Two or more of the plurality of memory structures STR1 to STRn may be connected with the peripheral circuit 120 through the same inter-metal layer of the plurality of inter-metal layers IML1 to IMLn−1. For example, although not illustrated in FIG. 11, the first and second memory structures STR1 and STR2 may be connected to the peripheral circuit 120 through the second inter-metal layer IML2.

Figure 12:
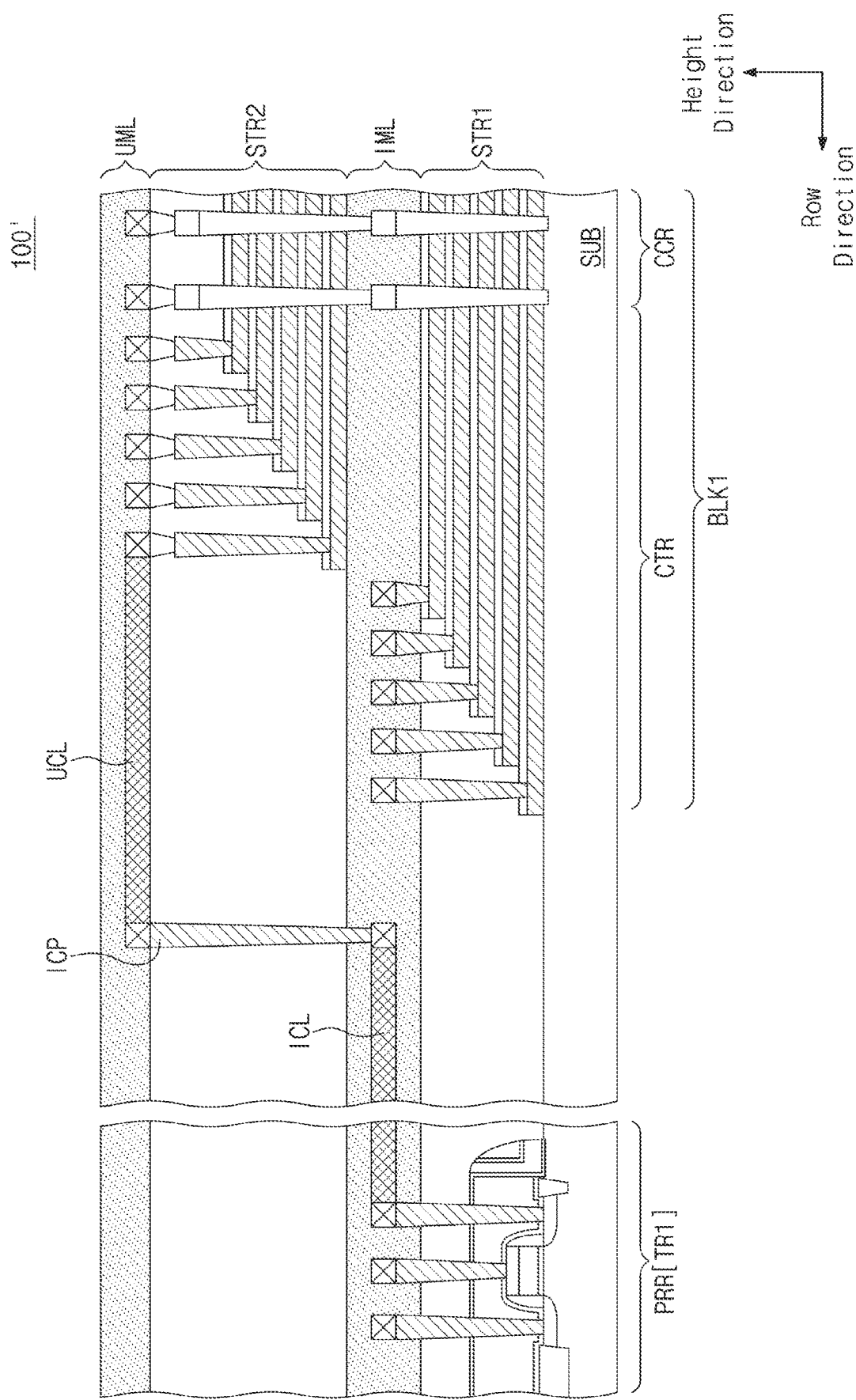
FIG. 12 is a sectional view illustrating a nonvolatile memory device according to some example embodiments of the inventive concepts.

FIG. 12 is a sectional view illustrating a nonvolatile memory device according to some example embodiments of the inventive concepts. Referring to FIG. 12, a nonvolatile memory device 100' may include a first memory block BLK1 and a first transistor TR1. The first memory block BLK1 may include the first memory structure STR1 and the second memory structure STR2. The first and second memory structures STR1 and STR2 may be electrically connected to each other through the inter-metal layer IML. Since the first memory block BLK1 is similar to the first memory block BLK1 of FIG. 4, a description thereof will not be here repeated. In some example embodiments, the first memory block BLK1 illustrated in FIG. 12 may be replaced with any one of the second to sixth memory blocks BLK2 to BLK6 described above.

Lines of the second memory structure STR2 may be connected with the peripheral circuit 120 through the upper metal layer UML. In this case, the upper conductive line UCL provided in the upper metal layer UML may be connected with the inter-metal layer IML through an intermediate contact plug ICP, also referred to herein as an "additional conductive line" of the inter-metal layer that is connected with one upper conductive line UCL of the plurality of upper conductive lines UCL of the upper metal layer UML. The intermediate contact plug ICP may be connected with the peripheral circuit 120 through an intermediate conductive line ICL of the inter-metal layer IML. In other words, all or a part of the lines of the second memory structure STR2 may be connected with the peripheral circuit 120 through the upper metal layer UML and the inter-metal layer IML. That is, as the upper conductive line UCL of the upper metal layer UML is connected with the intermediate conductive line ICL of the inter-metal layer IML, the complexity of the layout of the upper metal layer UML may decrease.

Figure 13:
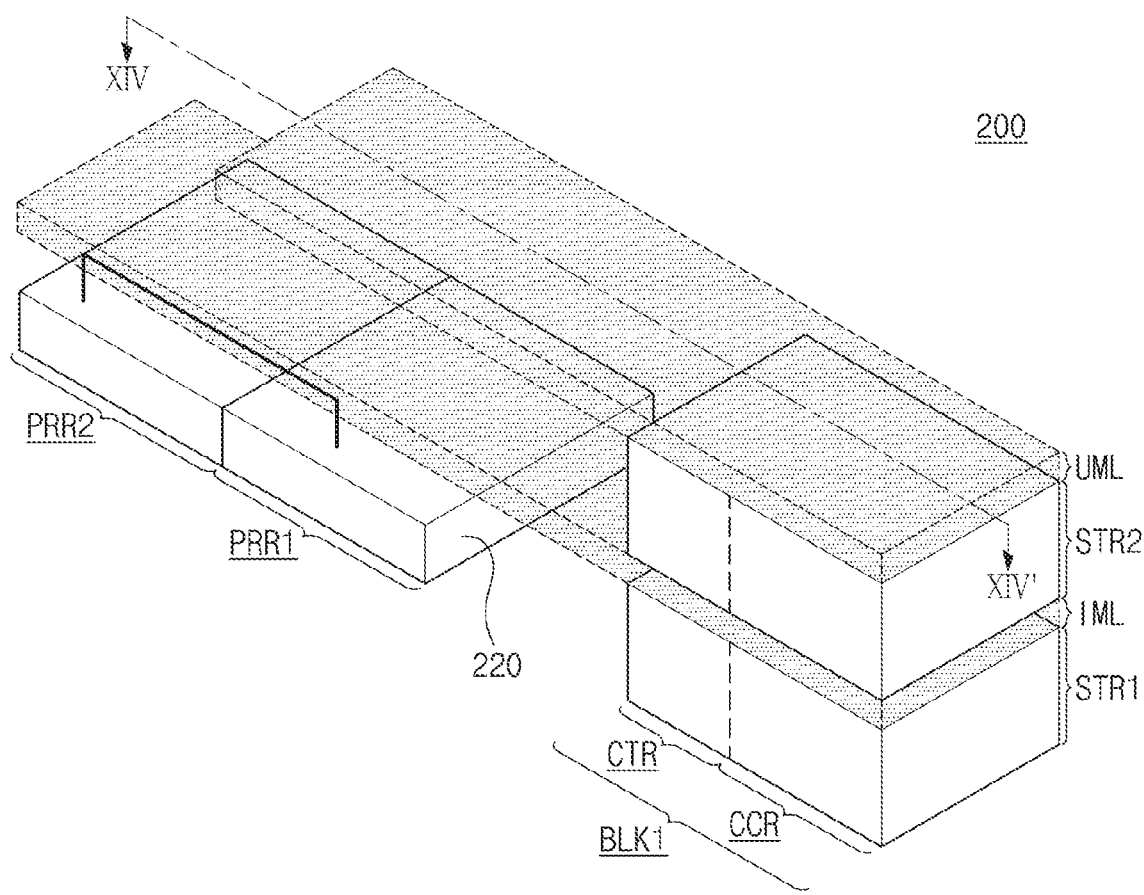
FIG. 13 is a view for describing a nonvolatile memory device according to some example embodiments of the inventive concepts.

FIG. 13 is a view for describing a nonvolatile memory device according to some example embodiments of the inventive concepts. For brevity of illustration and brief description, a three-dimensional structure of a nonvolatile memory device 200 is conceptually illustrated in FIG. 13. Also, for convenience of description, a description associated with components that are the same as the above-described components will not be repeated here.

Referring to FIG. 13, the nonvolatile memory device 200 may include the first memory block BLK1 and a peripheral circuit 220. The first memory block BLK1 may be divided into the cell core region CCR and the contact region CTR and may include the first memory structure STR1 and the second memory structure STR2. The first memory structure STR1 and the second memory structure STR2 may be connected with each other through the inter-metal layer IML and may be connected with the peripheral circuit 220 through the inter-metal layer IML and the upper metal layer UML. The first memory block BLK1 is similar to the first memory block BLK1 of FIGS. 3 and 4, and thus, a detailed description thereof will not be repeated here. In some example embodiments, the first memory block BLK1 may be replaced with any one of the second to sixth memory blocks BLK2 to BLK6 described above.

In some example embodiments, the peripheral circuit 220 may include a first peripheral circuit region PRR1 and a second peripheral circuit region PRR2. In this case, components included in the first peripheral circuit region PRR1 and components included in the second peripheral circuit region PRR2 may be electrically connected with each other to control the first memory block BLK1. In some example embodiments, the components included in the first peripheral circuit region PRR1 and the components included in the second peripheral circuit region PRR2 may be electrically connected with each other through the inter-metal layer IML. For example, a first transistor included in the first peripheral circuit region PRR1 and a second transistor included in the second peripheral circuit region PRR2 may be connected with each other through an intermediate conductive line ICL of the inter-metal layer IML. That is, since components (or elements) of the peripheral circuit 220 are connected with each other through the inter-metal layer IML, the complexity of the layout of the peripheral circuit 220 is reduced. Also, since components (or elements) of the peripheral circuit 120 are connected with each other without a contact plug connected with the upper metal layer UML, it is easy to design the peripheral circuit 220.

Figure 14:
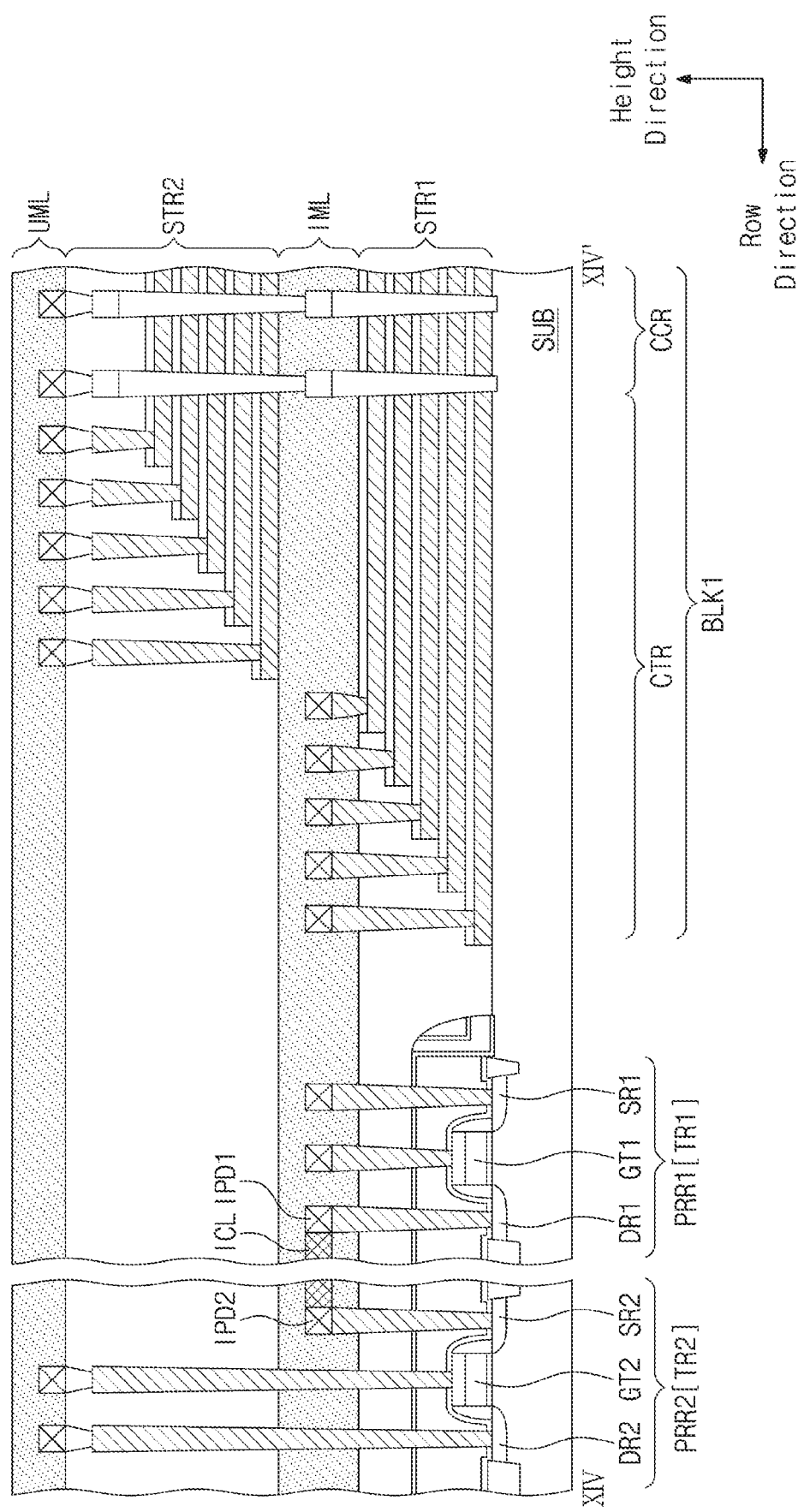
FIG. 14 is a sectional view of a nonvolatile memory device of FIG. 13 taken along a line XIV-XIV'.

FIG. 14 is a sectional view of the nonvolatile memory device 200 of FIG. 13 taken along a line XIV-XIV'. For a brief description, a description associated with components that are the same as the above-described components will not be repeated here. Referring to FIG. 14, the nonvolatile memory device 200 may include the first memory block BLK1 and the peripheral circuit 220. The first memory block BLK1 may be divided into the cell core region CCR and the contact region CTR and may include the first memory structure STR1 and the second memory structure STR2. The first memory structure STR1 and the second memory structure STR2 may be connected with each other through the inter-metal layer IML and may be connected with the peripheral circuit 220 through the inter-metal layer IML and the upper metal layer UML.

As described above, the peripheral circuit 220 may include a first transistor TR1 and a second transistor TR2 formed on the first peripheral circuit region PRR1 and the second peripheral circuit region PRR2. A first drain DR1 of the first transistor TR1 may be connected with a first intermediate pad IPD1 through a contact plug. The first intermediate pad IPD1 may be connected with a second intermediate pad IPD2 through an intermediate conductive line ICL. The second intermediate pad IPD2 may be connected with a second source region SR2 of the second transistor TR2 through a contact plug. That is, the first and second transistors TR1 and TR2 of a peripheral circuit 220 may be electrically connected with each other through an intermediate conductive line ICL (e.g., an "additional conductive line") of the inter-metal layer IML.

In some example embodiments, a first gate GT1 and a first source SR1 of the first transistor TR1 may be connected with intermediate pads of the inter-metal layer IML through contact plugs, and a second gate GT2 and a second drain DR2 of the second transistor TR2 may be connected with upper pads UPD of the upper metal layer UML through contact plugs. That is, components (e.g., TR1 and TR2) included in the peripheral circuit 220 may be connected with each other through the inter-metal layer IML or the upper metal layer UML or may be connected with any other corresponding components through the inter-metal layer IML or the upper metal layer UML. As such, since interconnections of the peripheral circuit 220 are formed through various layers, the complexity in layout is reduced.

Figure 16:
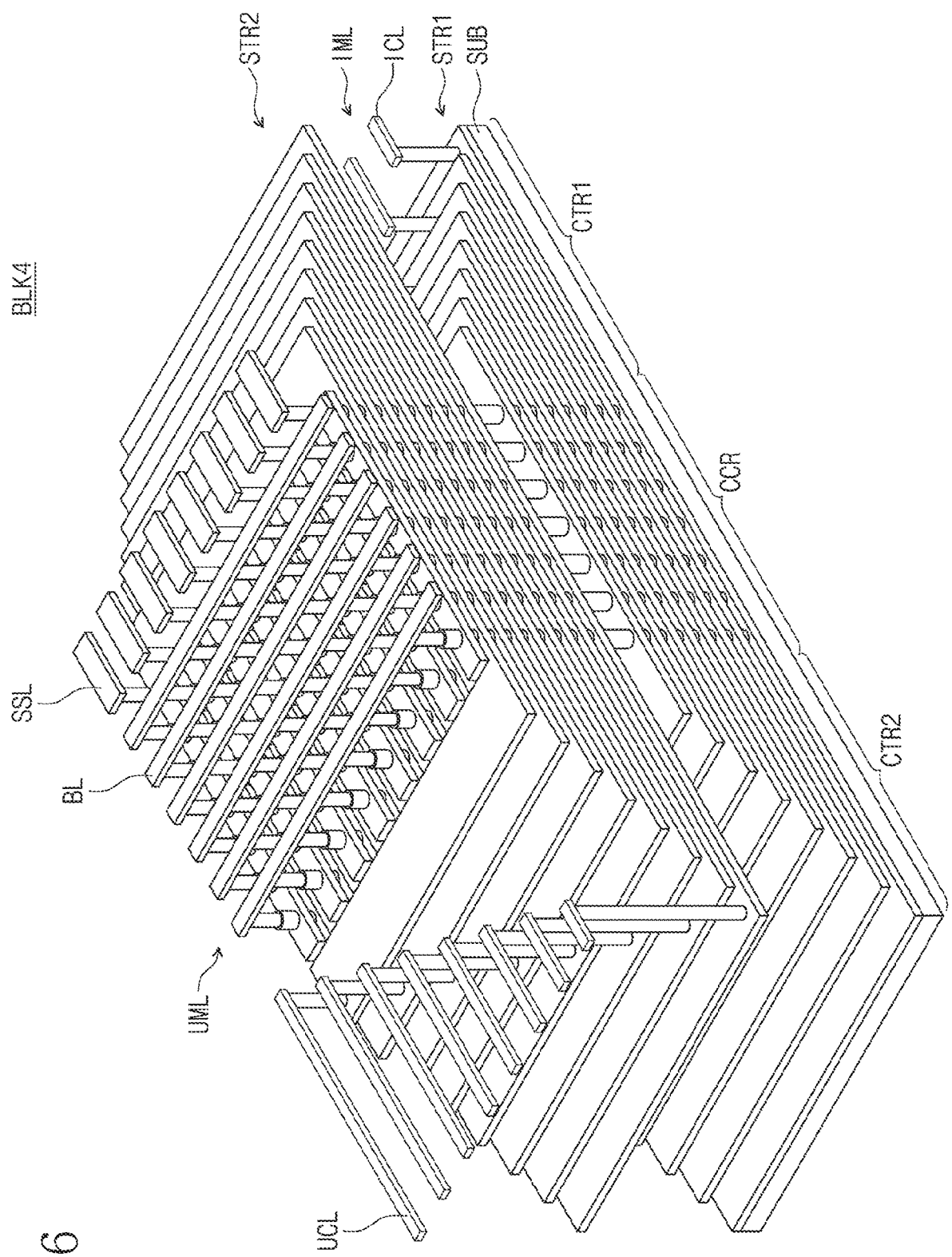
Figure 17:
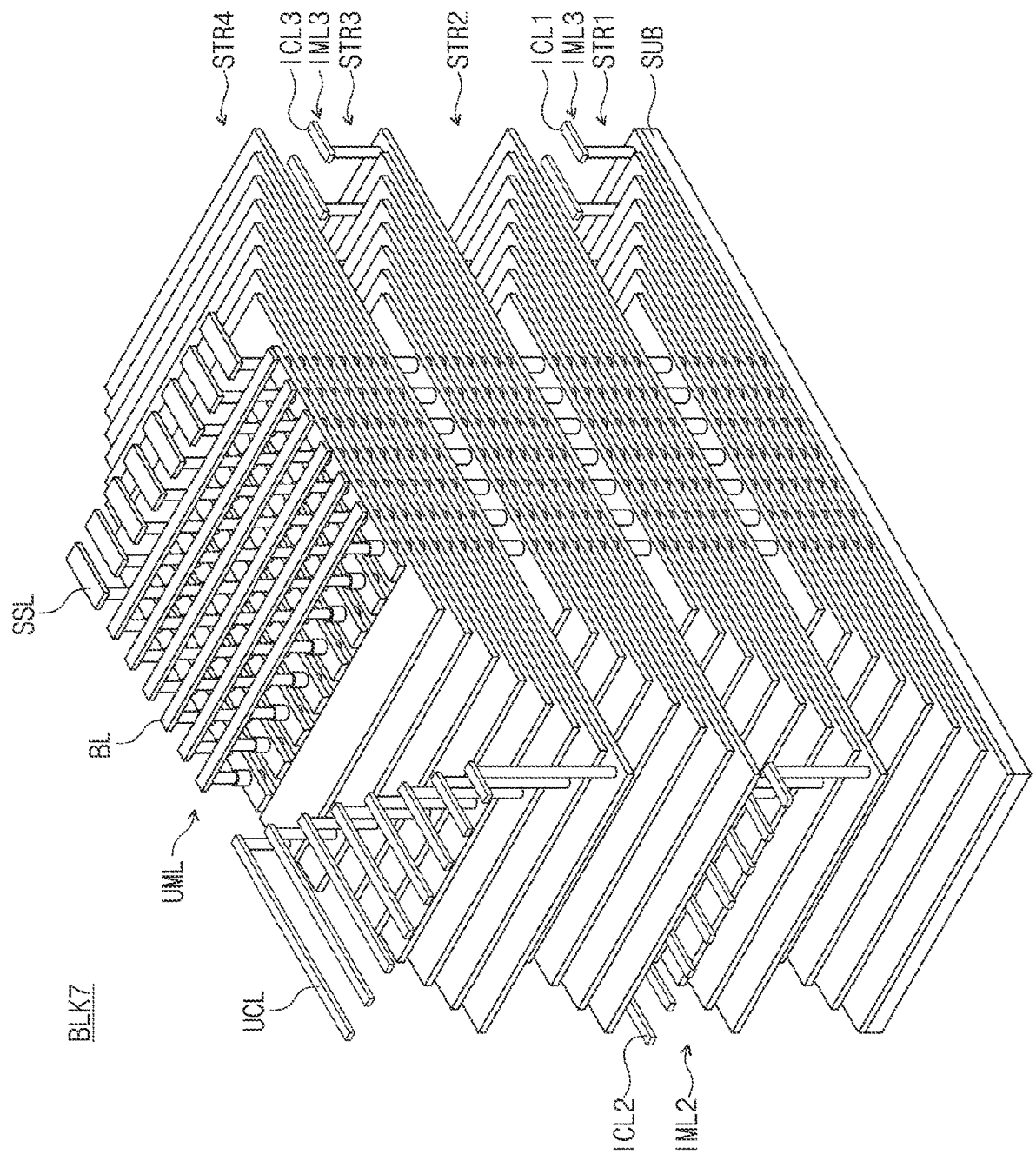

FIGS. 15, 16, and 17 are exemplary section views of memory blocks according to some example embodiments of the inventive concepts. Structures of some memory blocks according to some example embodiments of the inventive concepts will be described with reference to FIGS. 15 to 17. However, the inventive concepts is not limited thereto.

Referring to FIG. 15, the second memory block BLK2 may include the first memory structure STR1, the second memory structure STR2, the inter-metal layer IML, and the upper metal layer UML. Each of the first and second memory structures STR1 and STR2 may include a plurality of lines stacked in a direction perpendicular to the substrate SUB. The first and second memory structures STR1 and STR2 may be electrically connected to each other through the inter-metal layer IML. For example, a plurality of first pillars of the first memory structure STR1 and a plurality of second pillars PL2 of the second memory structure STR2 may be electrically connected with each other through intermediate connection pads of the inter-metal layer IML.

As described above, a plurality of lines of the first memory structure STR1 may be connected with a peripheral circuit (not illustrated) through a plurality of intermediate conductive lines ICL included in the inter-metal layer IML, and a plurality of lines of the second memory structure STR2 may be connected with the peripheral circuit through a plurality of upper conductive lines UCL included in the upper metal layer UML. In some example embodiments, the upper metal layer UML may be a layer including conductive lines for connecting a bit line(s) BL and a string selection line(s) SSL.

Referring to FIG. 16, the fourth memory block BLK4 may include the first memory structure STR1, the second memory structure STR2, the inter-metal layer IML, and the upper metal layer UML. Each of the first and second memory structures STR1 and STR2 may include a plurality of lines stacked in a direction perpendicular to the substrate SUB. The first and second memory structures STR1 and STR2 may be electrically connected to each other through the inter-metal layer IML.

As described above, a plurality of lines of the first memory structure STR1 may be connected with a peripheral circuit (not illustrated) through a plurality of intermediate conductive lines ICL included in the inter-metal layer IML, and a plurality of lines of the second memory structure STR2 may be connected with the peripheral circuit through a plurality of upper conductive lines UCL included in the upper metal layer UML. In this case, a plurality of contact plugs for connecting the plurality of lines and the plurality of intermediate conductive lines ICL of the first memory structure STR1 may be provided in the first contact region CTR1 of the first memory structure STR1, and a plurality of contact plugs for connecting the plurality of lines and the plurality of upper conductive lines UCL of the second memory structure STR2 may be provided in the second contact region CTR2 of the second memory structure STR2.

Referring to FIG. 17, the seventh memory block BLK7 may include the first to fourth memory structures STR1 to STR4, the first to third inter-metal layers IML1 to IML3, and the upper metal layer UML. Each of the first to fourth memory structures STR1 to STR4 may include a plurality of lines stacked in a direction perpendicular to the substrate SUB. The first to fourth memory structures STR1 to STR4 may be electrically connected to each other through the first to third inter-metal layers IML1 to IML3.

As described above, a plurality of lines of the first memory structure STR1 may be connected with a peripheral circuit (not illustrated) through first intermediate conductive lines ICL1 included in the first inter-metal layer IML1; a plurality of lines of the second memory structure STR2 may be connected with the peripheral circuit through second intermediate conductive lines ICL2 included in the second inter-metal layer IML2; and a plurality of lines of the third memory structure STR3 may be connected with the peripheral circuit through third intermediate conductive lines ICL3 included in the third inter-metal layer IML3, and a plurality of lines of the fourth memory structure STR4 may be connected with the peripheral circuit through a plurality of upper conductive lines included in the upper metal layer UML.

The memory blocks BLK2, BLK4, and BLK7 illustrated in FIGS. 15 to 17 are exemplified to describe the technical idea of the inventive concepts easily without being limited thereto.

As described above, a nonvolatile memory device according to the inventive concepts may include a memory block having a three-dimensional structure, and the memory block may include multi-stacked memory structures. The memory structures may be connected with a peripheral circuit through different layers. As such, the complexity of the layout associated with interconnections of the memory structures may decrease, and the size of the memory block may decrease. Accordingly, the nonvolatile memory device having the reduced area is provided.

Figure 18:
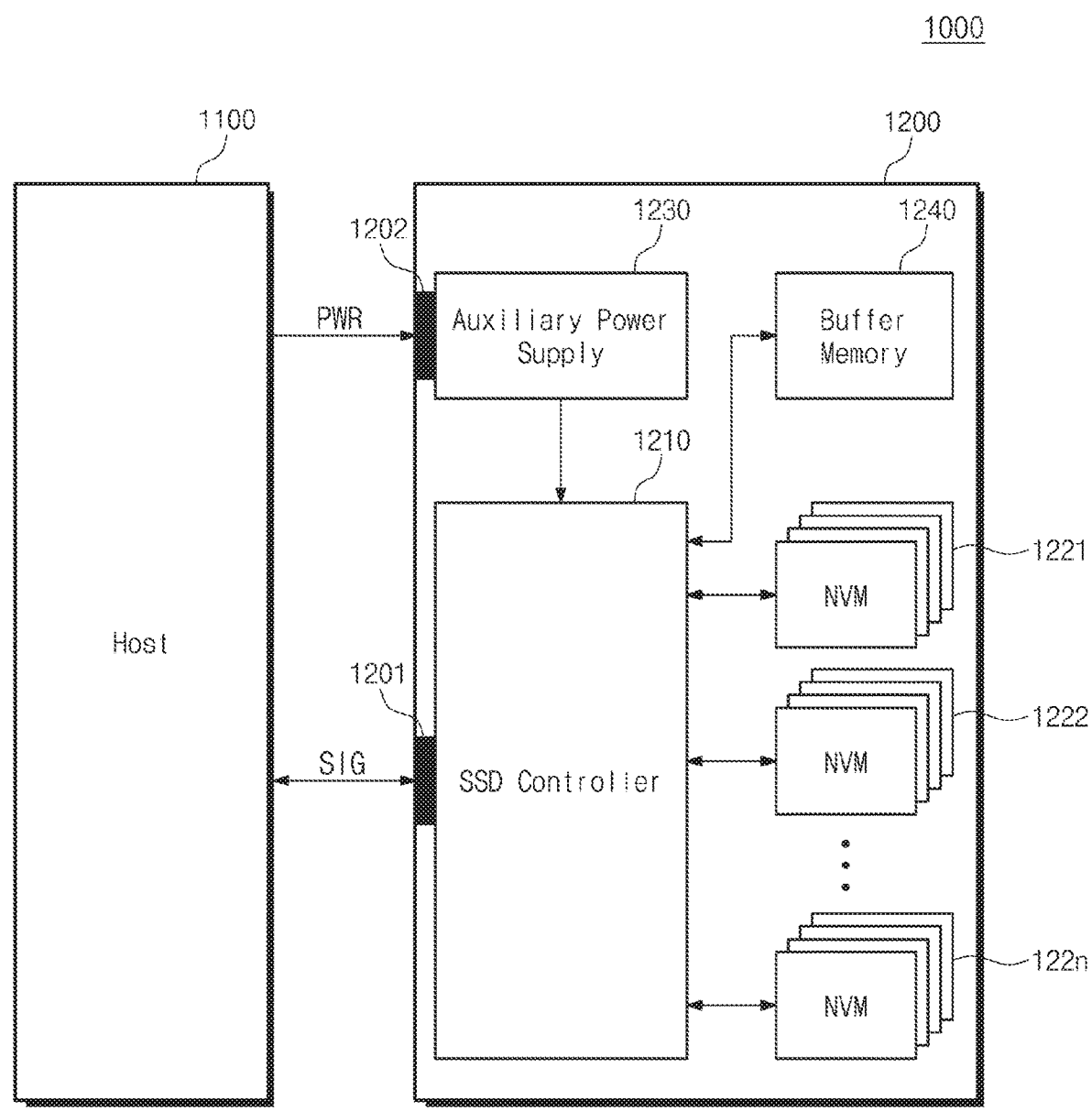
FIG. 18 is a block diagram illustrating a solid state drive system to which the nonvolatile memory device according to some example embodiments of the inventive concepts is applied.

FIG. 18 is a block diagram illustrating a solid state drive (SSD) system 1000 to which a nonvolatile memory device according to the inventive concepts is applied. Referring to FIG. 18, the SSD system 1000 includes a host 1100 and an SSD 1200.

The SSD 1200 transmits and receives a signal SIG to and from the host 1100 through a signal connector 1201 and is supplied with power PWR through a power connector 1202. The SSD 1200 includes an SSD controller 1210, a plurality of flash memories 1221 to 122n, an auxiliary power supply 1230, and a buffer memory 1240. In some example embodiments, each of the plurality of flash memories 1221 to 122n may be implemented with a separate chip or a separate package and may be recognized as a physical space SP by the host 1100.

The SSD controller 1210 may control the plurality of flash memories 1221 to 122n in response to the signal SIG from the host 1100. The plurality of flash memories 1221 to 122n may operate under control of the SSD controller 1210. The auxiliary power supply 1230 may be connected to the host 1100 via the power connector 1202. In some example embodiments, each of the plurality of flash memories 1221 to 122n may include memory blocks or memory structures described with reference to FIGS. 1 to 17. The auxiliary power supply 1230 may be charged by the power PWR from the host 1100. In the case where the power PWR is not smoothly supplied from the host 1100, the auxiliary power supply 1230 may provide the power of the SSD system 1200.

A nonvolatile memory device according to the inventive concepts includes multi-stacked memory structures. The memory structures may be connected with a peripheral circuit through different layers. Accordingly, since the complexity of the layout associated with interconnections connected with the memory structures is reduced, a memory device having the reduced area is provided.

While the inventive concepts has been described with reference to exemplary embodiments thereof, it will be apparent to those of ordinary skill in the art that various changes and modifications may be made thereto without departing from the spirit and scope of the inventive concepts as set forth in the following claims.

What is claimed is:

1. A memory device, comprising:
   a substrate;
   a first memory structure directly on the substrate such that the first memory structure is in contact with the substrate, the first memory structure including a plurality of first word lines stacked on the substrate in a direction perpendicular to a top surface of the substrate;
   an inter-metal layer directly on the first memory structure such that the inter-metal layer is in contact with the first memory structure, the inter-metal layer including a plurality of intermediate pads, the plurality of intermediate pads connected with separate, respective first word lines of the plurality of first word lines;
   a second memory structure directly on the inter-metal layer such that the second memory structure is in contact with the inter-metal layer and the inter-metal layer is directly between the first and second memory structures, the second memory structure including a plurality of second word lines stacked on the inter-metal layer in the direction perpendicular to the top surface of the substrate; and
   an upper metal layer directly on the second memory structure such that the upper metal layer is in contact with the second memory structure and the second memory structure is directly between the upper metal layer and the inter-metal layer, the upper metal layer including a plurality of upper pads, the plurality of upper pads connected with separate, respective second word lines of the plurality of second word lines,
   wherein,
   the first memory structure further includes a first pillar penetrating the plurality of first word lines,
   the second memory structure further includes a second pillar penetrating the plurality of second word lines,
   the inter-metal layer further includes an intermediate connection pad configured to electrically couple the first pillar and the second pillar to each other, and
   the upper metal layer further includes a bit line electrically coupled to the second pillar.

2. The memory device of claim 1, wherein
   the inter-metal layer further includes a plurality of intermediate conductive lines, the plurality of intermediate conductive lines connected with separate, respective intermediate pads of the plurality of intermediate pads, and the upper metal layer further includes a plurality of upper conductive lines, the plurality of upper conductive lines connected with separate, respective upper pads of the plurality of upper pads.

3. The memory device of claim 2, further comprising:
a peripheral circuit connected with both the plurality of intermediate conductive lines and the plurality of upper conductive lines.

4. The memory device of claim 2, wherein the inter-metal layer further includes an additional conductive line, the additional conductive line connected with one upper conductive line of the plurality of upper conductive lines.

5. The memory device of claim 1, wherein
the first memory structure further includes a plurality of first contact plugs, the plurality of first contact plugs configured to electrically couple separate, respective first word lines of the plurality of first word lines to separate, respective intermediate pads of the plurality of intermediate pads; and
the second memory structure further includes a plurality of second contact plugs, the plurality of second contact plugs configured to electrically couple separate, respective second word lines of the plurality of second word lines to separate, respective upper pads of the plurality of upper pads.

6. The memory device of claim 5, wherein
each memory structure of the first and second memory structures includes a first contact region, a second contact region, and a core region, the first contact region on a first side of the core region and the second contact region on a second side of the core region, the second side is opposite to the first side, and
the plurality of first contact plugs are in the first contact region of the first memory structure and the plurality of second contact plugs are in the second contact region of the second memory structure.

7. The memory device of claim 1, wherein
the first memory structure further includes a ground selection line, and
the upper metal layer further includes an additional upper pad connected with the ground selection line.

8. A memory device, comprising:
a substrate;
a first memory structure directly on the substrate such that the first memory structure is in contact with the substrate, the first memory structure including
a plurality of first word lines stacked on the substrate in a direction perpendicular to a top surface of the substrate, and
a plurality of first pillars penetrating the plurality of first word lines on the substrate;
an inter-metal layer directly on the first memory structure such that the inter-metal layer is in contact with the first memory structure, the inter-metal layer including
a plurality of intermediate pads, the plurality of intermediate pads connected with separate, respective first word lines of the plurality of first word lines, and
a plurality of intermediate connection pads, the plurality of intermediate connection pads connected with separate, respective first pillars of the plurality of first pillars;
a second memory structure directly on the inter-metal layer such that the second memory structure is in contact with the inter-metal layer and the inter-metal layer is directly between the first and second memory structures, the second memory structure including
a plurality of second word lines stacked on the inter-metal layer in the direction perpendicular to the top surface of the substrate, and
a plurality of second pillars penetrating the plurality of second word lines on the inter-metal layer, the plurality of second pillars connected with separate, respective intermediate connection pads of the plurality of intermediate connection pads; and
an upper metal layer directly on the second memory structure such that the upper metal layer is in contact with the second memory structure and the second memory structure is directly between the upper metal layer and the inter-metal layer, the upper metal layer including a plurality of upper pads, the plurality of upper pads connected with separate, respective second word lines of the plurality of second word lines,
wherein the upper metal layer further includes a plurality of bit lines electrically coupled to separate, respective second pillars of the plurality of second pillars.

9. The memory device of claim 8, wherein
the inter-metal layer further includes a plurality of intermediate conductive lines connected with separate, respective intermediate pads of the plurality of intermediate pads, and
the upper metal layer further includes a plurality of upper conductive lines connected with separate, respective upper pads of the plurality of upper pads.

10. The memory device of claim 9, further comprising:
a peripheral circuit connected with both the plurality of intermediate conductive lines and the plurality of upper conductive lines.

* * * * *